(12) United States Patent
Tatsumura et al.

(10) Patent No.: US 10,643,671 B2
(45) Date of Patent: May 5, 2020

(54) SEMICONDUCTOR DEVICE

(71) Applicant: Kabushiki Kaisha Toshiba, Minato-ku (JP)

(72) Inventors: Kosuke Tatsumura, Yokohama (JP); Keiji Ikeda, Kawasaki (JP); Tsutomu Tezuka, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/897,596

(22) Filed: Feb. 15, 2018

(65) Prior Publication Data

US 2019/0088288 A1 Mar. 21, 2019

(30) Foreign Application Priority Data

Sep. 20, 2017 (JP) .................................. 2017-180714

(51) Int. Cl.
*G11C 5/06* (2006.01)
*G11C 11/40* (2006.01)
*H01L 29/786* (2006.01)
*G11C 19/28* (2006.01)
*G06F 5/10* (2006.01)

(52) U.S. Cl.
CPC .............. *G11C 5/06* (2013.01); *G06F 5/10* (2013.01); *G11C 11/40* (2013.01); *G11C 19/282* (2013.01); *G11C 19/287* (2013.01); *H01L 29/7869* (2013.01)

(58) Field of Classification Search
None
See application file for complete search history.

(56) References Cited

U.S. PATENT DOCUMENTS

| 7,671,397 | B2 | 3/2010 | Fujita et al. |
| 8,023,309 | B2 | 9/2011 | Tanaka et al. |
| 8,866,139 | B2 | 10/2014 | Ino |
| 9,040,948 | B2 | 5/2015 | Ribeiro et al. |
| 10,043,808 | B1 | 8/2018 | Tezuka et al. |
| 2013/0069052 | A1* | 3/2013 | Sandhu ............... H01L 21/8254 257/43 |
| 2018/0269210 | A1 | 9/2018 | Tezuka et al. |

FOREIGN PATENT DOCUMENTS

| JP | 4405427 | 1/2010 |
| JP | 5106031 | 12/2012 |
| JP | 5721839 | 5/2015 |
| JP | 6010172 | 10/2016 |

* cited by examiner

*Primary Examiner* — Douglas King
(74) *Attorney, Agent, or Firm* — Oblon, McClelland, Maier & Neustadt, L.L.P.

(57) ABSTRACT

According to an embodiment, a semiconductor device includes a plurality of first interconnections, a plurality of gate dielectric films, and a plurality of second interconnections. The plurality of first interconnections are oxide semiconductors formed in parallel at predetermined intervals in a first direction. The plurality of gate dielectric films are formed on surfaces of the first interconnections, respectively. The plurality of second interconnections are conductors formed at predetermined intervals in parallel to a second direction orthogonal to the first direction, respectively, to bridge over the gate dielectric films.

12 Claims, 18 Drawing Sheets

SEMICONDUCTOR DEVICE

CROSS-REFERENCE TO RELATED APPLICATIONS

This application is based upon and claims the benefit of priority from Japanese Patent Application No. 2017-180714, filed on Sep. 20, 2017; the entire contents of which are incorporated herein by reference.

FIELD

Embodiments described herein relate generally to a semiconductor device.

BACKGROUND

A hardware accelerator having a memory (on-chip memory) on a same chip is used in a data-centric application represented by a deep neural network (DNN) or the like. The data-centric application requires a hardware accelerator having a large-capacity on-chip memory. However, a further improvement in the density of an SRAM (Static Random Access Memory) is considerably difficult.

It is known that the on-chip memory is mostly used for a FIFO (First-in First-out) memory. Therefore, an improvement in the density of the FIFO memory can also contribute to realization of a large-capacity on-chip memory.

BRIEF DESCRIPTION OF THE DRAWINGS

FIG. 16 is a diagram illustrating a first example of waveforms of signals in the controller;

DETAILED DESCRIPTION

Figure 1:
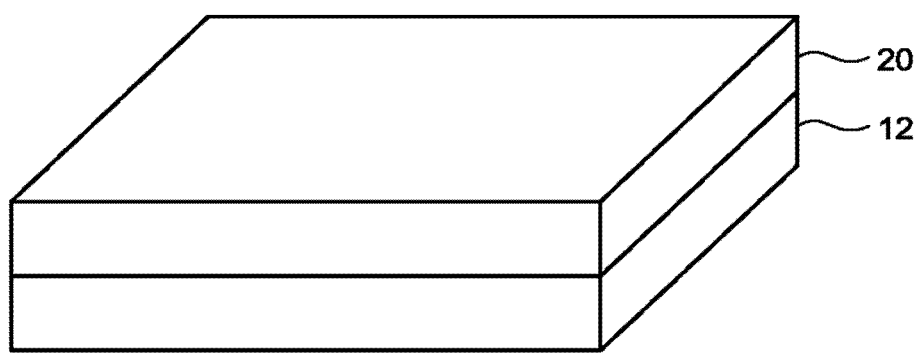
FIG. 1 is a diagram illustrating an external appearance of a memory device according to an embodiment.

According to an embodiment, a semiconductor device includes a plurality of first interconnections, a plurality of gate dielectric films, and a plurality of second interconnections. The plurality of first interconnections are oxide semiconductors formed in parallel at predetermined intervals in a first direction. The plurality of gate dielectric films are formed on surfaces of the first interconnections, respectively. The plurality of second interconnections are conductors formed at predetermined intervals in parallel to a second direction orthogonal to the first direction, respectively, to bridge over the gate dielectric films.

A memory device 10 according to an embodiment is explained below with reference to the accompanying drawings. In the following embodiment, because elements denoted by like reference characters have substantially identical configurations and are operated in substantially identically, other than differences between these elements, redundant explanations thereof are appropriately omitted.

FIG. 1 is a diagram illustrating an external appearance of the memory device 10 according to the embodiment. The memory device 10 includes a substrate 12 and a memory unit 20. The substrate 12 includes a semiconductor circuit and the like, which are formed on a silicon chip.

The memory unit 20 is a layer containing an oxide semiconductor. The memory unit 20 stores therein data to be processed by the semiconductor circuit formed in the substrate 12. The memory unit 20 is a FIFO memory. The substrate 12 and the memory unit 20 are connected, for example, with an interlayer interconnection electrically interposed therebetween.

The substrate 12 and the memory unit 20 can be a part of a multi-layer substrate including three or more layers. Other layers can be inserted between the substrate 12 and the memory unit 20. The memory device 10 alternatively can be an on-chip memory provided in a semiconductor device including a processing circuit such as a CPU (Central Processing Unit), an FPGA (Field Programmable Gate Array), or a GPU (Graphics Processing Unit).

Figure 2:
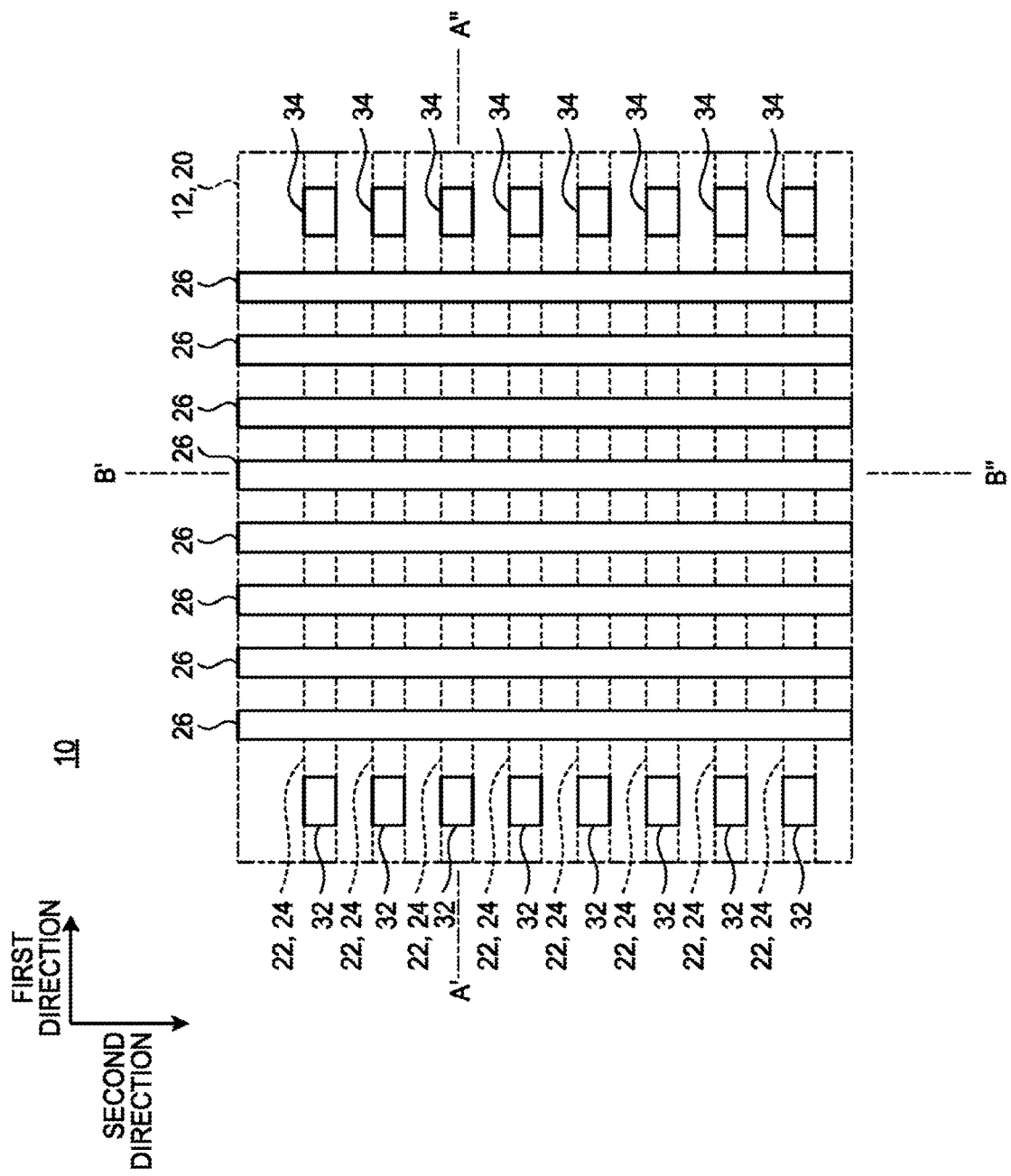
FIG. 2 is a diagram illustrating interconnection positions of the memory device as viewed from a top surface side.
Figure 3:
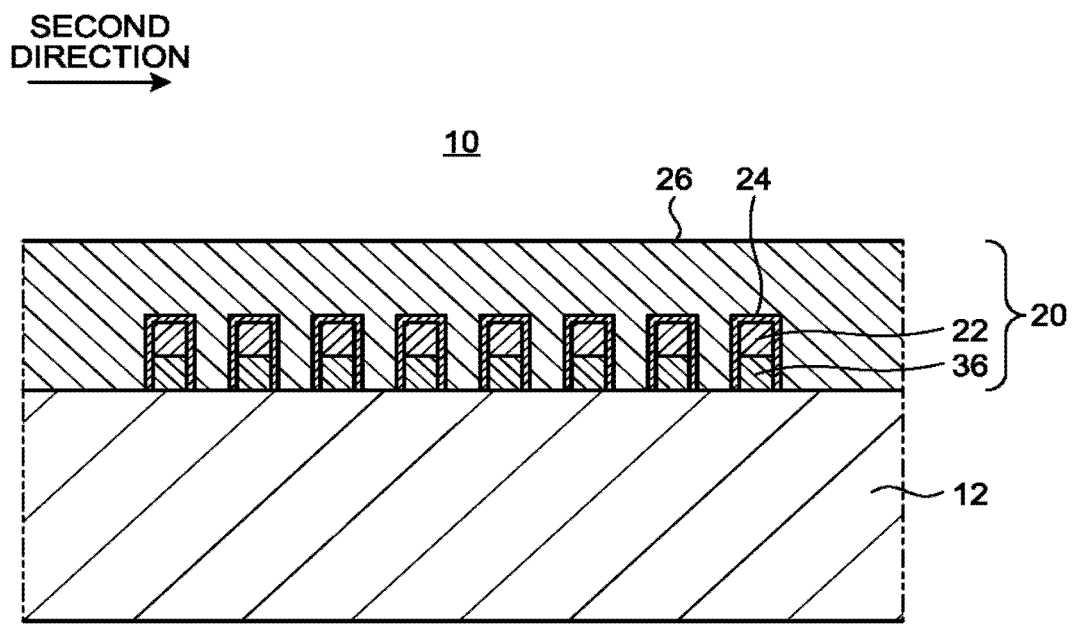
FIG. 3 is a sectional view of a part of the memory device corresponding to a line A'-A"
Figure 4:
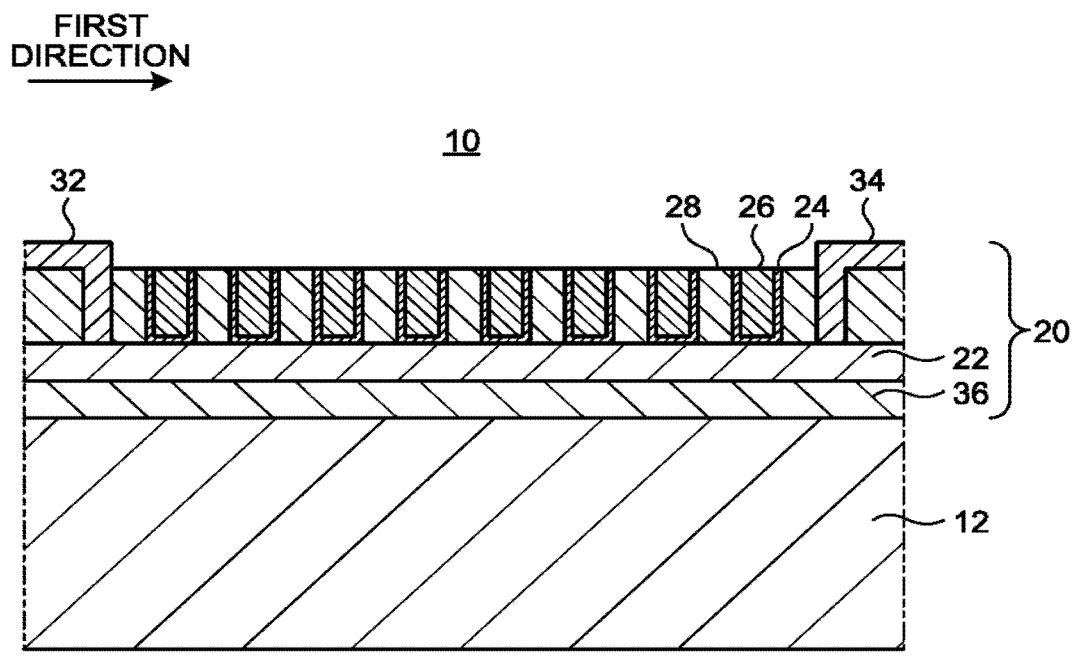
FIG. 4 is a sectional view of a part of the memory device corresponding to a line B'-B"

FIG. 2 is a diagram illustrating interconnection positions in the memory device 10 as viewed from a top surface side. FIG. 3 is a sectional view of a part of the memory device 10 corresponding to a line A'-A" in FIG. 2. FIG. 4 is a sectional view of a part of the memory device 10 corresponding to a line B'-B" in FIG. 2.

The memory unit 20 includes a plurality of first interconnections 22, a plurality of gate dielectric films 24, a plurality of second interconnections 26, a spacer 28, a plurality of input terminals 32, and a plurality of output terminals 34.

The first interconnections 22 are formed in wire shapes along a first direction. For example, the first interconnections 22 have wire shapes with a same width and are placed at predetermined intervals (equal intervals, for example). That is, the first interconnections 22 are placed at an equal interval in parallel to the first direction.

Each of the first interconnections 22 is an oxide semiconductor. For example, each of the first interconnections 22 can be an oxide semiconductor so-called IGZO containing indium (In), gallium (Ga), and zinc (Zn). For example, the first interconnections 22 can be n-type metal oxide semiconductors such as InGaZnO, InSnZnO, InZnO, InGaSnZnO, $In_2O_3$, $Ga_2O_3$, or ZnO.

Each of the first interconnections 22 is stacked on the substrate 12. Each of the first interconnections 22 can be stacked on the substrate 12 with a buffer layer 36 interposed therebetween. In the present embodiment, the buffer layers 36 are stacked on the substrate 12 and the first interconnections 22 are stacked on the buffer layers 36.

The gate dielectric films 24 are formed on surfaces of the first interconnections 22, respectively. The gate dielectric films 24 are, for example, a silicon oxide, a silicon nitride, or a silicon carbide such as a $SiO_2$, SiN, SiON, or SiOCN. The gate dielectric films 24 alternatively can be, for example, a metal oxide, a metal nitride, or a metal carbide having a higher dielectric constant than that (3.9) of $SiO_2$, such as $Al_2O_3$, $HfO_2$, HfSiON, or HfAlON.

The second interconnections 26 are formed in wire shapes along a second direction orthogonal to the first direction to bridge over the gate dielectric films 24. For example, the second interconnections 26 have wire shapes with a same width and are placed at predetermined intervals (equal intervals, for example). That is, the second interconnections 26 are placed at an equal interval in parallel to the second direction.

Each of the second interconnections 26 is a conductor. In the present embodiment, each of the second interconnections 26 is metal. For example, the second interconnections 26 can be metal such as copper (Cu), tungsten (W), molybdenum (Mo), or titanium nitride (TiN). The second interconnections 26 alternatively can be oxide conductive films such as ITO(In—SnO).

The spacer 28 is formed to fill spaces between adjacent ones of the second interconnections 26. The spacer 28 is an insulator. Material examples of the spacer 28 are explained later.

The input terminals 32 are provided to correspond to the first interconnections 22 in a one-to-one relation. The input terminals 32 are conductors such as metal. Each of the input terminals 32 is connected to a start end being one of ends of the corresponding one of the first interconnections 22. The input terminals 32 are connected also to a circuit formed on the substrate 12 with an interlayer interconnection interposed therebetween.

The output terminals 34 are provided to correspond to the first interconnections 22 in a one-to-one relation. The output terminals 34 are conductors such as metal. Each of the output terminals 34 is connected to a terminal end being the opposite end to the start end of the corresponding first interconnection 22. The output terminals 34 are connected also to a circuit formed on the substrate 12 with an interlayer interconnection interposed therebetween.

In the memory unit 20 having the configuration described above, the first interconnections 22 and the second interconnections 26 are placed in a grid manner (a cross bar manner) as viewed from the top surface. A stack structure including a conductor, an insulating film, and a semiconductor is formed in regions in which the first interconnection 22, the gate dielectric film 24, and the second interconnection 26 overlap with each other. When a voltage different from a peripheral region is applied to the conductor in the stack structure, a potential well is formed in the semiconductor. Therefore, when a voltage different from that in peripheral second interconnections 26 is applied to any of the second interconnections 26, potential wells are formed in regions of the first interconnections 22 to which the voltage is applied. These potential wells can hold charges.

The second interconnections 26 are placed on the first interconnections 22 at equal intervals. Therefore, when a position to which a voltage different from the peripheral region is applied is moved sequentially, for example, in the first direction, the potential wells formed in the first interconnections 22 are also moved with the movement of the position. Therefore, the first interconnections 22 can move the held charges in the first direction due to the movement of the position of the potential wells.

The second interconnections 26 are placed apart from each other at a predetermined distance. Accordingly, the first interconnections 22 have portions where the second interconnection 26 is not formed immediately thereon. No voltage is applied to these portions from immediately thereon. However, because fringe capacitive coupling with adjacent ones of the second interconnections 26 occurs on these portions, an energy barrier changes according to voltages applied to the adjacent second interconnections 26. Therefore, potential wells are formed also in the portions of the first interconnections 22 where the second interconnection 26 is not formed immediately thereon.

It is preferable that the permittivity of the spacer 28 be higher to cause the fringe capacitive coupling between the position of the first interconnections 22 where the second interconnection 26 is not formed immediately thereon and the adjacent second interconnections 26. For example, the spacer 28 is preferably a high-dielectric material having a higher dielectric constant than that of $SiO_2$. For example, the spacer 28 can be a silicon oxide, a silicon nitride, or a silicon carbide such as SiN, SiON, or SiOCN and be a high-dielectric material having a higher dielectric constant than that of $SiO_2$. The spacer 28 can be a metal oxide, a metal nitride, or a metal carbide having a higher dielectric constant than that of $SiO_2$, such as $Al_2O_3$, $HfO_2$, HfSiON, or HfAlON.

While the gate dielectric films 24 are formed between the second interconnections 26 and the spacer 28 in the present embodiment, it suffices that the gate dielectric films 24 are formed at least between the first interconnections 22 and the second interconnections 26.

Figure 5:
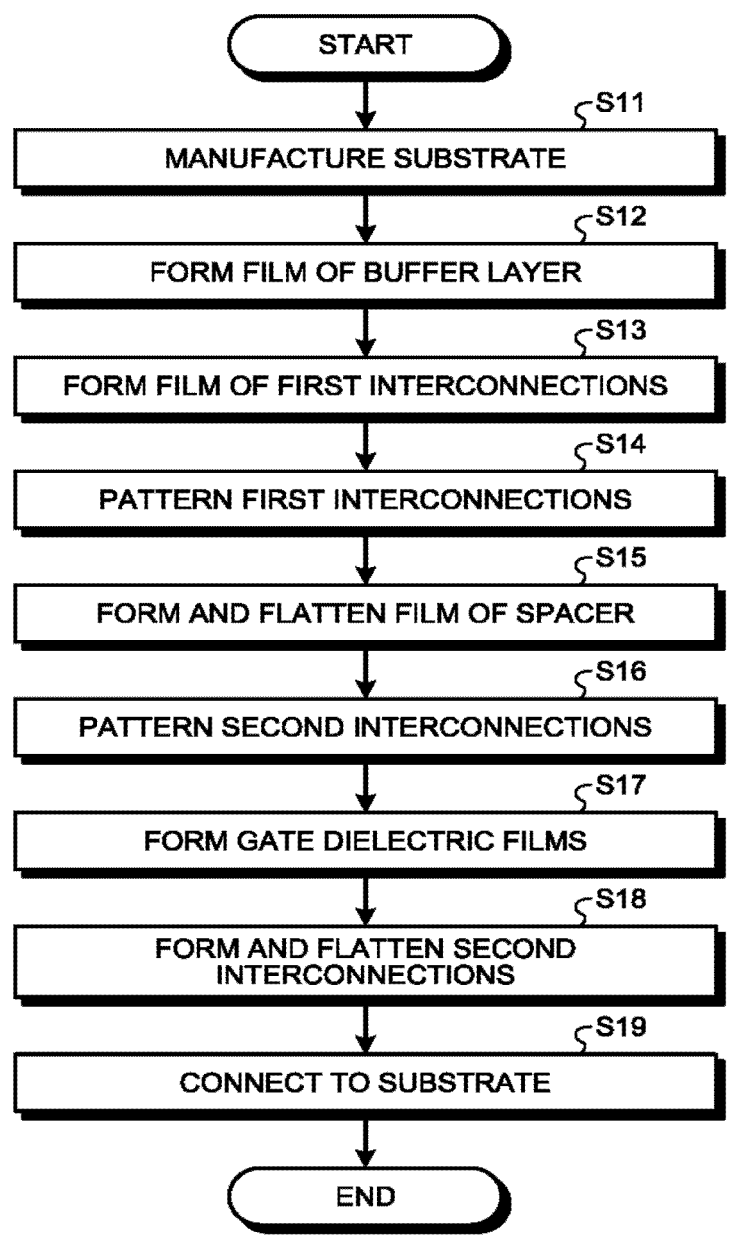
FIG. 5 is a diagram illustrating a manufacturing flow of the memory device.

FIG. 5 is a diagram illustrating a manufacturing flow of the memory device 10. First, at Step S11, the substrate 12 is manufactured. Next, a film of the buffer layers 36 is formed on the substrate 12 at Step S12. Subsequently, a film of the first interconnections 22 is formed on the film of the buffer layers 36 at Step S13. Subsequently, the films of the first interconnections 22 and the buffer layer 36 are patterned by photolithography and reactive etching at Step S14.

Next, at Step S15, a film of the spacer 28 is formed on the first interconnections 22 and the surface of the formed film of the spacer 28 is flattened. Subsequently, at Step S16, the film of the spacer 28 is processed by the photolithography and the reactive etching to pattern the spacer 28 to obtain spaces for forming regions of the second interconnections 26.

Next, at Step S17, the gate dielectric films 24 are formed in the spaces for forming the regions of the second interconnections 26 by a chemical vapor deposition method (CVD method) or an atomic layer deposition method (ALD method). Subsequently, at Step S18, the second interconnections 26 are formed on the gate dielectric films 24 by the chemical vapor deposition method or a sputtering method and the surfaces of the formed second interconnections 26 are flattened.

Thereafter, at Step S19, the interlayer interconnections, the terminals, and the like are formed and the memory unit 20 and the substrate 12 are connected to each other.

Figure 6:
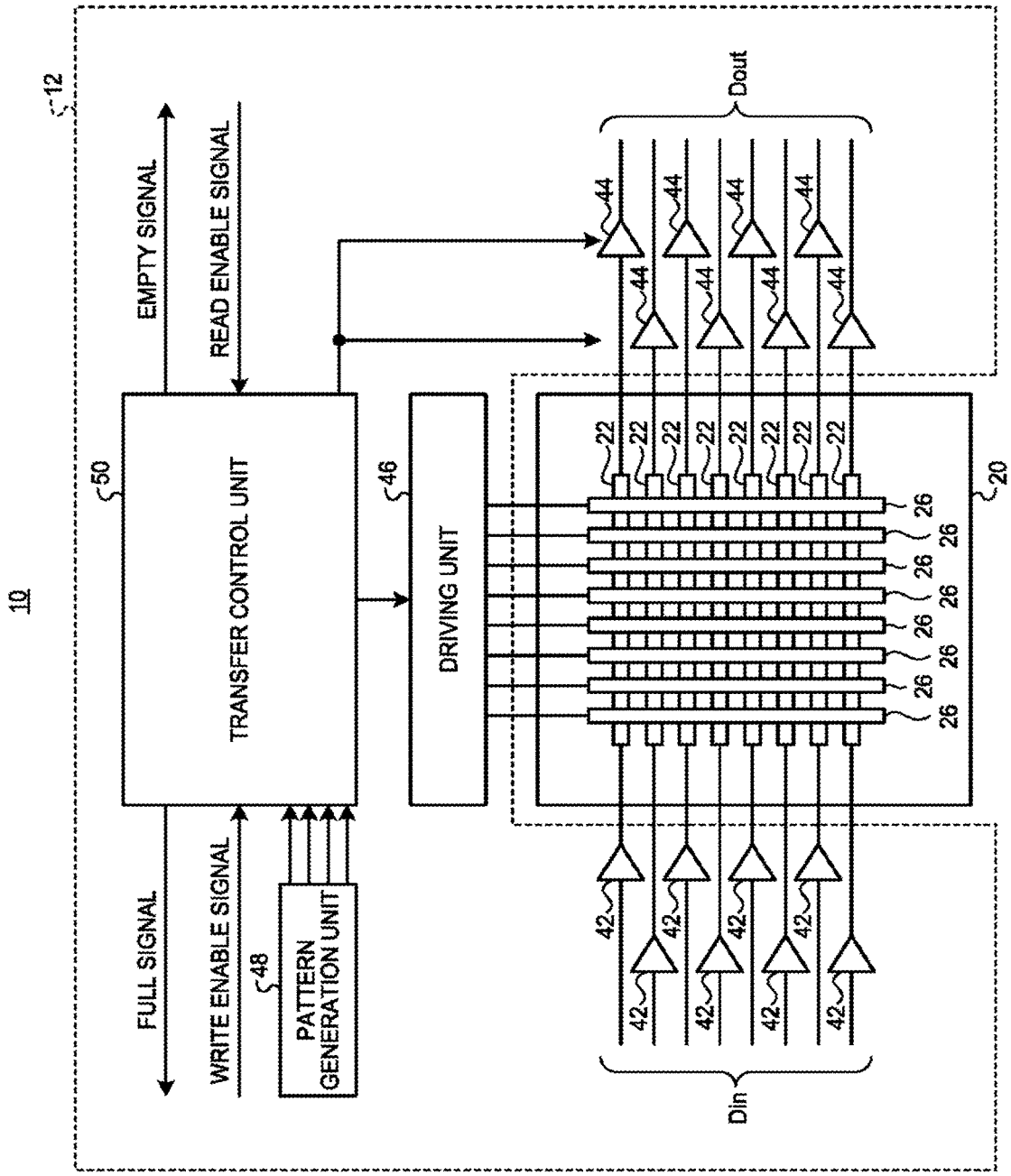
FIG. 6 is a diagram illustrating a configuration of the memory device.

FIG. 6 is a diagram illustrating a configuration of the memory device 10 according to the present embodiment. The memory device 10 includes the memory unit 20, a plurality of injectors 42 (a plurality of charge injectors), a plurality of detectors 44, a driver 46, a pattern generator 48, and a transfer controller 50.

The injectors 42, the detectors 44, the driver 46, the pattern generator 48, and the transfer controller 50 are included in the substrate 12. A part or all of the injectors 42, the detectors 44, the driver 46, the pattern generator 48, and the transfer controller 50 can be included in layers other than the substrate 12.

The injectors 42 are provided to correspond to the first interconnections 22 in a one-to-one relation. Each of the injectors 42 receives corresponding input data from a circuit at the previous stage. In the present embodiment, the injectors 42 receive parallel plural pieces of input data (Din) from the circuit at the previous stage, at each of predetermined periods (transfer cycles). The transfer cycles of the input data (Din) can include an invalid transfer cycle at which injection (write) of input data is not performed.

Each of the injectors 42 injects charges to the start end being one of ends of the corresponding one of the first interconnections 22 according to the received input data. In the present embodiment, each of the injectors 42 injects charges according to the input data received from the circuit at the previous stage to the start end at each of the transfer cycles. Each of the injectors 42 does not need to inject charges at an invalid transfer cycle. For example, each of the injectors 42 supplies charges to the start end of the corresponding first interconnection 22 via the interlayer interconnection and the input terminal 32.

In the present embodiment, each of the injections units 42 receives binary input data representing 0 (L) or 1 (H). Each of the injectors 42 does not inject charges to a potential well formed at the start end of the corresponding first interconnection 22 when the corresponding input data represents 0 (L). That is, each of the injectors 42 performs an operation (charge drawing operation) to empty charges of the potential well. Each of the injectors 42 injects a predetermined quantity of charges to the potential well formed at the start end of the corresponding first interconnection 22 when the corresponding input data represents 1 (H). Alternatively, each of the injectors 42 can inject charges when the input data represents 0 (L) and empty charges of the potential well when the input data represents 1 (H).

The input data can be multi-valued. In this case, each of the injectors 42 injects a quantity of charges according to the value of the input data to the potential well formed at the start end of the corresponding first interconnection 22. For example, in a case of 2-bit data, data of one sample includes information of 2 bits and represents four states of 00, 01, 10, and 11. In this case, each of the injectors 42 injects one of four different quantities of charges (including zero) according to the input data.

The detectors 44 are provided to correspond to the first interconnections 22 in a one-to-one relation. Each of the detectors 44 extracts charges held in the terminal end being the opposite end to the start end of the corresponding first interconnection 22 and outputs output data according to the extracted charges when receiving a read enable signal from a circuit at the subsequent stage. In the present embodiment, the detectors 44 receive the read enable signal at a timing different from a timing at which valid data is input. In the present embodiment, the detectors 44 supply parallel output data (Dout) to the circuit at the subsequent stage. For example, each of the detectors 44 extracts charges held in the terminal end of the corresponding first interconnection via the interlayer interconnection and the output terminal 34.

In the present embodiment, each of the detectors 44 outputs binary output data representing 0 (L) or 1 (H). Each of the detectors 44 outputs output data representing 0 (L) when a predetermined quantity of charges is not held in the potential well formed on the terminal end of the corresponding first interconnection 22. Each of the detectors 44 outputs output data representing 1 (H) when the predetermined quantity of charges is held in the potential well formed on the terminal end of the corresponding first interconnection 22. Alternatively, each of the detectors 44 can output the output data representing 0 (L) when a predetermined quantity of charges is held and output the output data representing 1 (H) when the predetermined quantity of charges is not held.

The output data can be multi-valued. In this case, each of the detectors 44 outputs output data of a value according to a quantity of charges held in the potential well formed at the terminal end of the corresponding first interconnection 22. For example, in a case of 2-bit data, each of the detectors 44 detects four different quantities of charges and outputs data in one of four states of 00, 01, 10, and 11 corresponding to the detected quantities of charges.

The driver 46 applies voltages to the second interconnections 26 under control of the transfer controller 50. More specifically, the driver 46 applies voltages to the second interconnections 26 to form potential wells at respective start ends of the first interconnections 22 and to move the formed potential wells in a direction from the start ends toward the terminal ends.

The pattern generator 48 generates pattern signals representing basic waveforms of voltages to be applied to the second interconnections 26. The pattern generator 48 generates pattern signals with same waveforms at each transfer cycle.

The transfer controller 50 receives a write enable signal indicating that the input data is valid from the circuit at the previous stage synchronously with the input data. At a transfer cycle in which the write enable signal is received, each of the injectors 42 injects charges according to the input data to the start end of the corresponding first interconnection 22.

The transfer controller 50 controls the voltages generated by the driver 46 to be applied to the second interconnections 26 to move the charges injected to the respective start ends of the first interconnections 22 in the direction toward the terminal ends. The transfer controller 50 can move the potential wells of one column in the direction toward the terminal ends at each transfer cycle by controlling the voltages to be applied to the second interconnections 26 in accordance with the pattern signals received from the pattern generator 48.

The transfer controller 50 receives a read enable signal instructing outputting of the output data from the circuit at the subsequent stage that receives the output data. Upon receipt of the read enable signal, the transfer controller 50 causes the detectors 44 to extract charges held in the terminal ends of the corresponding first interconnections 22 and to output signals according to the extracted charges.

The transfer controller 50 outputs a full signal indicating that new input data cannot be received to the circuit at the previous stage when the number of samples of stored data has reached the capacity limit and new input data cannot be received. The circuit at the previous stage outputs input data to the memory device 10 on a condition that the full signal is not output.

The transfer controller 50 outputs an empty signal indicating that new output data cannot be output to the circuit at the subsequent stage when there is no data stored and new output data cannot be output. The circuit at the subsequent stage outputs the read enable signal to the memory device 10 on a condition that the empty signal is not output.

The transfer controller 50 can output an almost full signal indicating that reception of input data will become impossible in a short time to the circuit at the previous stage when the number of samples of stored data is close to the capacity limit. The transfer controller 50 can output an almost empty signal indicating that outputting of output data will become impossible in a short time to the circuit at the subsequent stage when the number of samples of stored data is close to zero.

Figure 7:
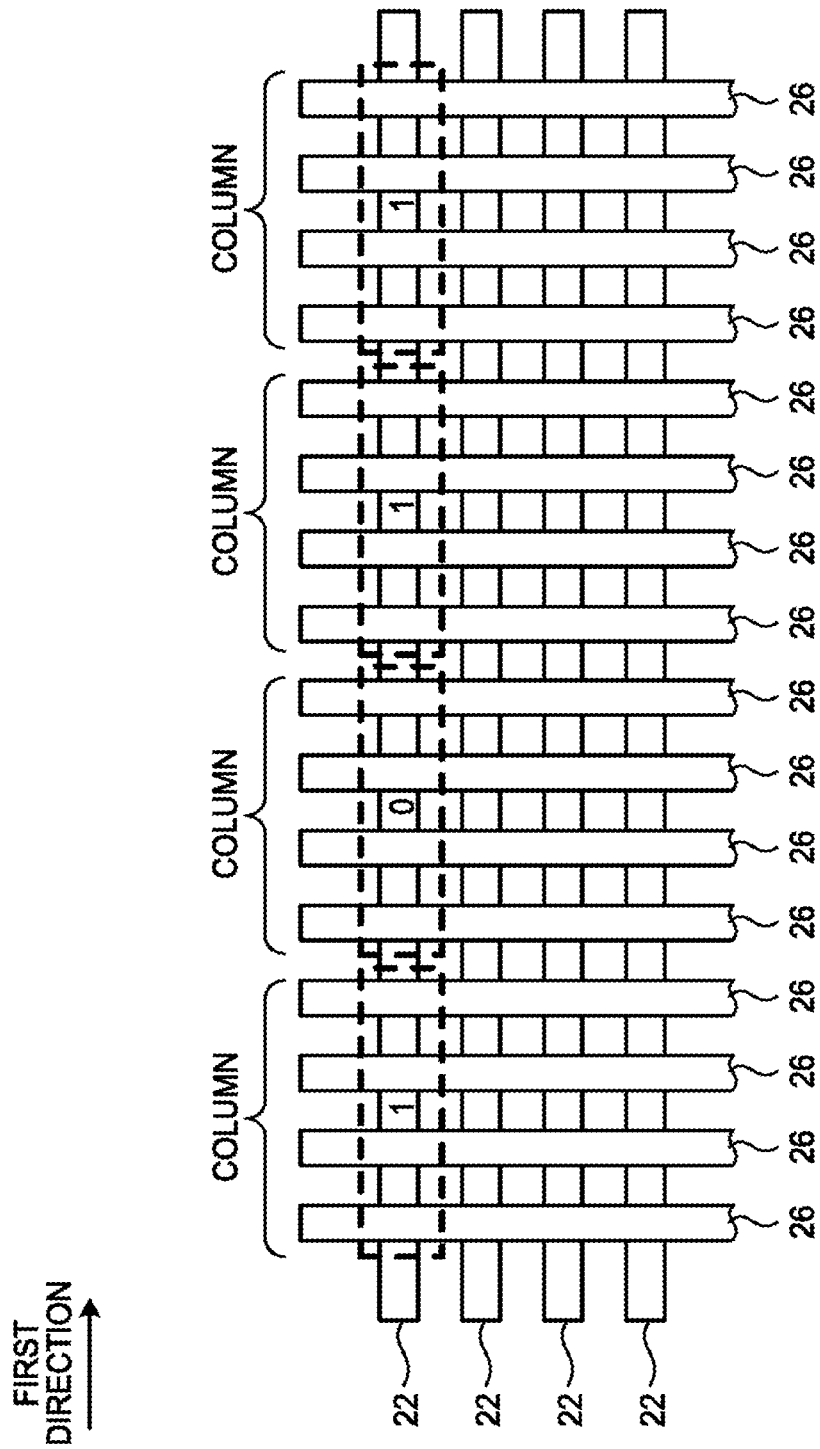
FIG. 7 is an explanatory diagram of columns.

FIG. 7 is an explanatory diagram of columns.

A unit to hold charges corresponding to data of one sample in the first interconnection 22 is referred to as "column". Each of the first interconnections 22 is divided into a plurality of columns in the first direction. Each of the columns is a region corresponding to a predetermined number equal to or larger than 2 of the second interconnections 26 and holds charges corresponding to data of one sample.

For example, in the example of FIG. 7, one column is formed in first interconnection 22 for each region corresponding to four second interconnections 26. Numbers 1 and 0 in FIG. 7 are examples of values of data corresponding to charges held in the corresponding columns.

The transfer controller 50 applies voltages to the second interconnections 26 to form one potential well in each column. Each of the injectors 42 injects charges according to input data of one sample to the top column located on the start end of the corresponding first interconnection 22.

The transfer controller 50 further applies voltages to the second interconnections 26 to move the potential well formed in each column to a column adjacent on a terminal end side at each transfer cycle. Accordingly, the transfer controller 50 can move the charges held in the respective potential wells in the direction from the start end toward the terminal end in each of the first interconnections 22.

Each of the detectors 44 extracts charges corresponding to output data of one sample from a last column located on the terminal end of the corresponding first interconnection 22.

Figure 8:
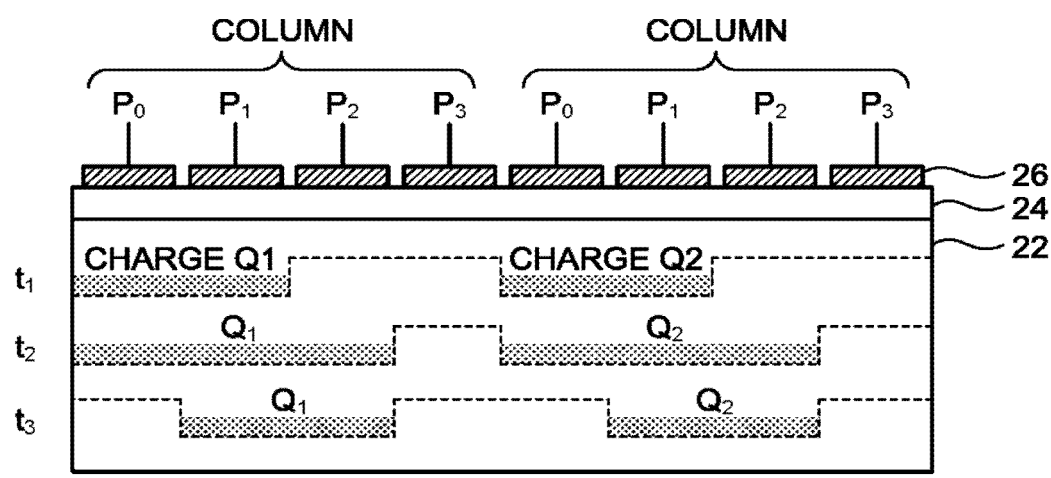
FIG. 8 is a diagram illustrating charges held in a first interconnection.
Figure 9:
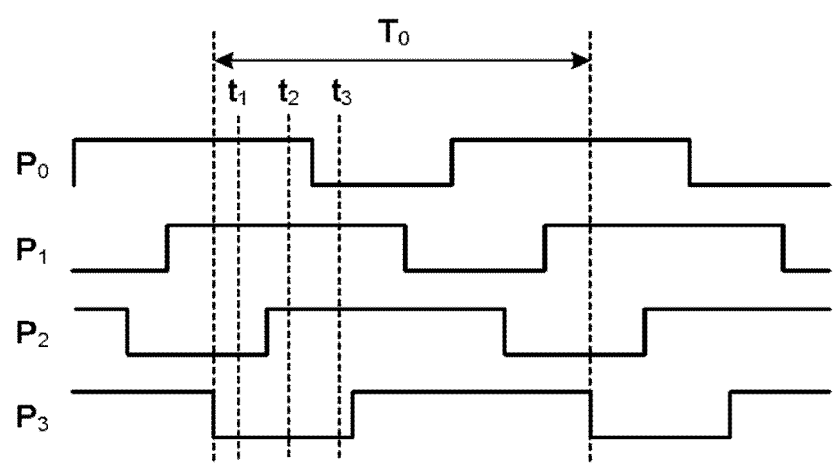
FIG. 9 is a waveform chart illustrating an example of voltage patterns to be applied to second interconnections.

FIG. 8 is a diagram illustrating positions of charges held in the first interconnection 22. FIG. 9 is a waveform chart illustrating an example of voltage patterns to be applied to the second interconnections 26. FIGS. 8 and 9 illustrate an example in which four second interconnections 26 form one column. A driving method illustrated in FIGS. 8 and 9 is referred to as "four-phase driving".

Dotted lines illustrated in FIG. 8 indicate heights of energy barriers formed at a time $t_1$, a time $t_2$, and a time $t_3$, respectively. $P_0$ in FIG. 9 indicates a voltage waveform applied to a first one of the second interconnections 26 from a start end side of each column. $P_1$ in FIG. 9 indicates a voltage waveform applied to a second one of the second interconnections 26 from the start end side of each column. $P_2$ in FIG. 9 indicates a voltage waveform applied to a third one of the second interconnections 26 from the start end side of each column. $P_3$ in FIG. 9 indicates a voltage waveform applied to a fourth one of the second interconnections 26 from the start end side of each column.

The transfer controller 50 repeatedly applies, for example, voltages in the waveform patterns as illustrated in FIG. 9 to the second interconnections 26. At any timing, one potential well that holds data of one sample is formed by two or more adjacent second interconnections 26 to which high voltages are applied. Two adjacent potential wells that can hold data of independent two samples are separated by a potential barrier formed by one or more adjacent second interconnections 26 to which low voltages are applied. This enables the transfer controller 50 to prevent charges held in one potential well from flowing into potential wells formed in adjacent columns. The transfer controller 50 can move the potential well to a column adjacent on the terminal end side at each transfer cycle ($T_0$).

Figure 10:
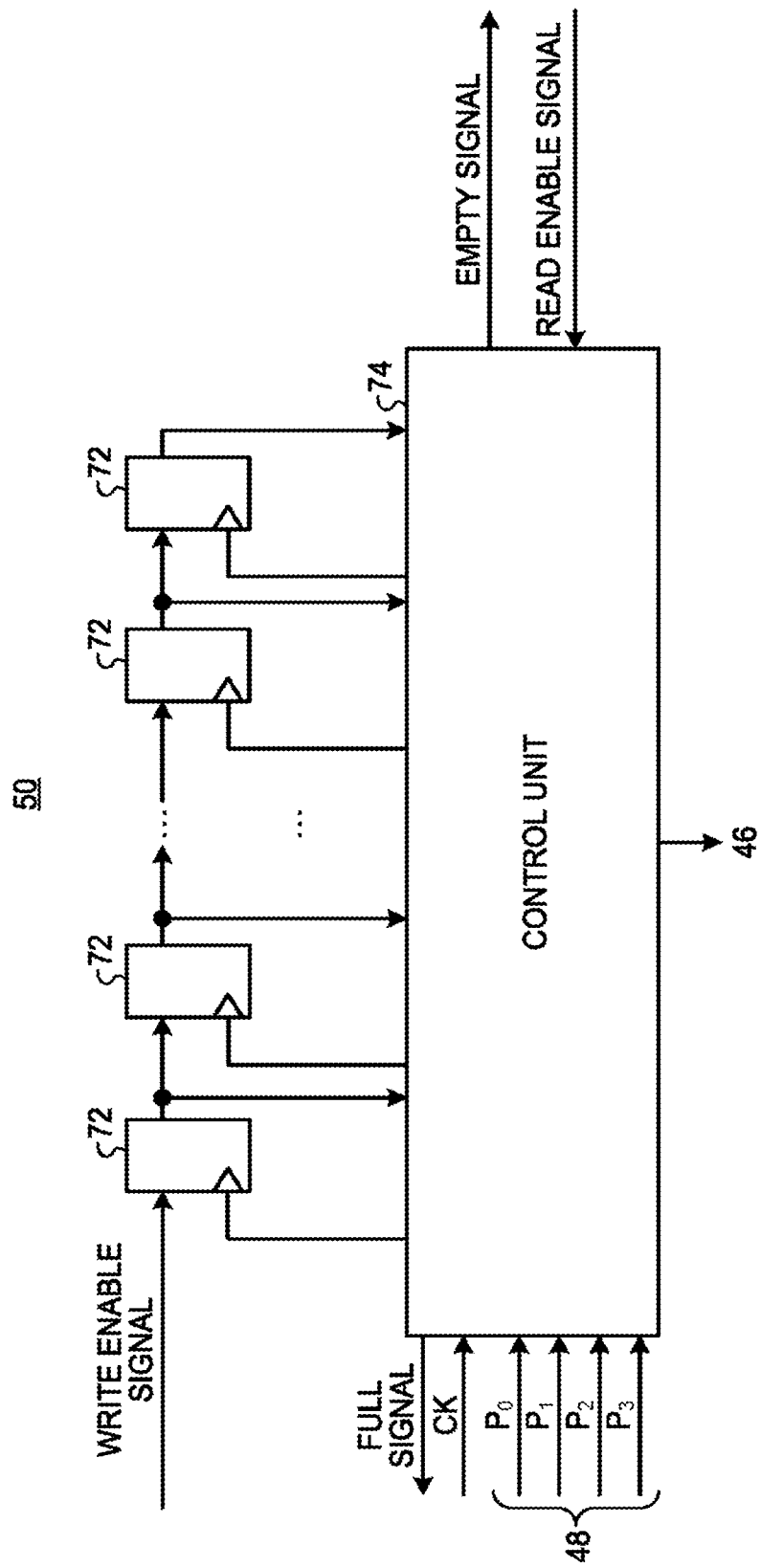
FIG. 10 is a diagram illustrating a configuration of a transfer controller.

FIG. 10 is a diagram illustrating a configuration of the transfer controller 50.

The transfer controller 50 includes a plurality of flag storages 72 and a controller 74. The flag storages 72 are provided to correspond to a plurality of columns from the top column to the last column in a one-to-one relation. Each of the flag storages 72 stores therein a flag indicating whether charges held in the corresponding column are valid.

When charges according to valid input data are injected to the top column, a write enable signal is written to the flag storage 72 corresponding to the top column among the flag storages 72. That is, when charges according to valid input data are injected to the top column, a flag indicating that the charges are valid is written to the flag storage 72 corresponding to the top column.

Each of the flag storages 72 corresponding to columns other than the top column receives a flag stored in one of the flag storages 72 corresponding to a column at the previous stage and holds therein the received flag when charges are transferred to the relevant column from the column at the previous stage. That is, the flag storages 72 function as a shift register that receives a write enable signal and transfers a flag sequentially to subsequent stages.

The controller 74 receives a clock signal (CK) indicating a timing of the transfer cycle, the pattern signals ($P_0$, $P_1$, $P_2$, and $P_3$) output from the pattern generator 48, and a read enable signal output from the circuit at the subsequent stage. The controller 74 receives flags stored in the flag storages 72.

The controller 74 controls the voltages generated by the driver 46 to be applied the second interconnections 26 to control the movement of the charges held in the columns in each of the first interconnections 22. The controller 74 further controls the movement of the flags stored in the flag storages 72 to be synchronized with the movement of the charges held in the columns.

The controller 74 outputs a full signal indicating that new input data cannot be received to the circuit at the previous stage when valid charges are held in all the columns. The controller 74 outputs an empty signal indicating that new output data cannot be output t circuit at the subsequent stage when valid charges are not held in the last column.

Figure 11:
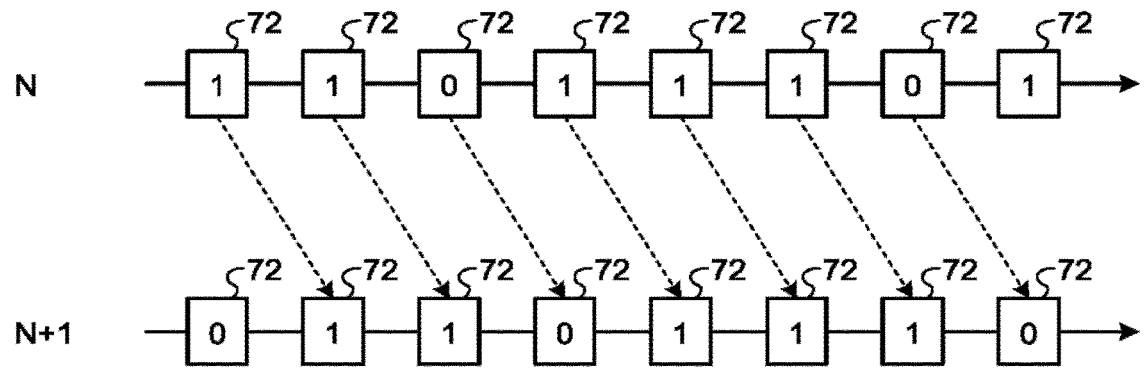
FIG. 11 is a diagram illustrating a first example of transfer processing performed by a controller.

FIG. 11 is a diagram illustrating transfer processing performed by the controller 74 when receiving a read enable signal.

When receiving a read enable signal, the controller 74 extracts charges from the last column and outputs output data of a value according to the extracted charges. The controller 74 further moves charges held in columns other than the last column to adjacent columns in the direction to the terminal end when receiving the read enable signal.

Along with this process, the controller 74 moves flags stored in the flag storages 72 corresponding to respective columns other than the last columns to the flag storages 72 corresponding to adjacent columns in the direction to the terminal end when receiving the read enable signal. That is, when receiving the read enable signal, the controller 74 shifts the flags stored in the flag storages 72 to subsequent stages as illustrated in FIG. 11.

Figure 12:
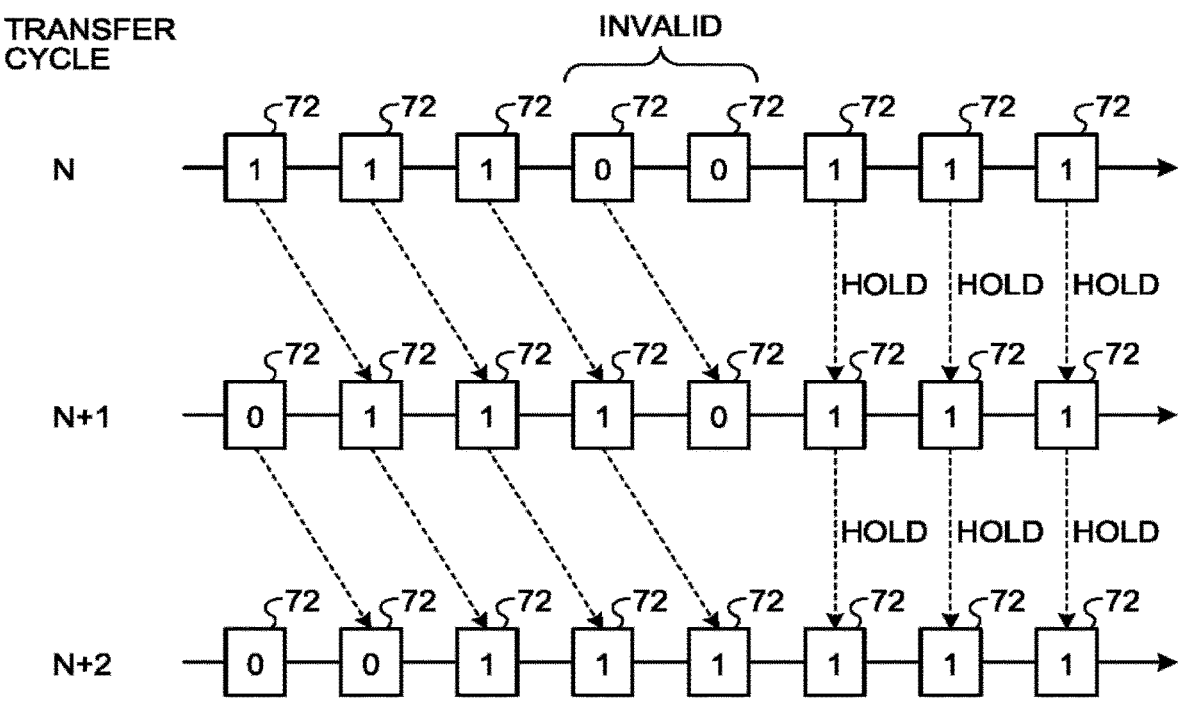
FIG. 12 is a diagram illustrating a second example of transfer processing performed by the controller.

FIG. 12 is a diagram illustrating transfer processing performed by the controller 74 when receiving no read enable signal.

In a case where no read enable signal is received and a flag indicating that the charges are not valid is stored in any of the flag storages 72, the controller 74 performs forward filling processing. Specifically, in the forward filling processing, the controller 74 specifies a flag storage 72, which is located closest to the terminal end among the flag storages 72 in which the flag indicating that the charges are not valid is stored. The controller 74 then moves charges held in columns located closer to the start end than a column corresponding to the specified flag storage 72 to columns adjacent in the direction to the terminal end.

Along with this process, in the forward filling processing, the controller 74 moves the flags stored in the flag storages 72 corresponding to the columns located closer to the start end than the column corresponding to the specified flag storage 72 to the flag storages 72 corresponding to the columns adjacent in the direction to the terminal end. That is, in the forward fill-up processing, the controller 74 controls the movement of charges to prevent columns that hold invalid charges from being located between two columns that hold valid charges as illustrated in FIG. 12.

Figure 13:
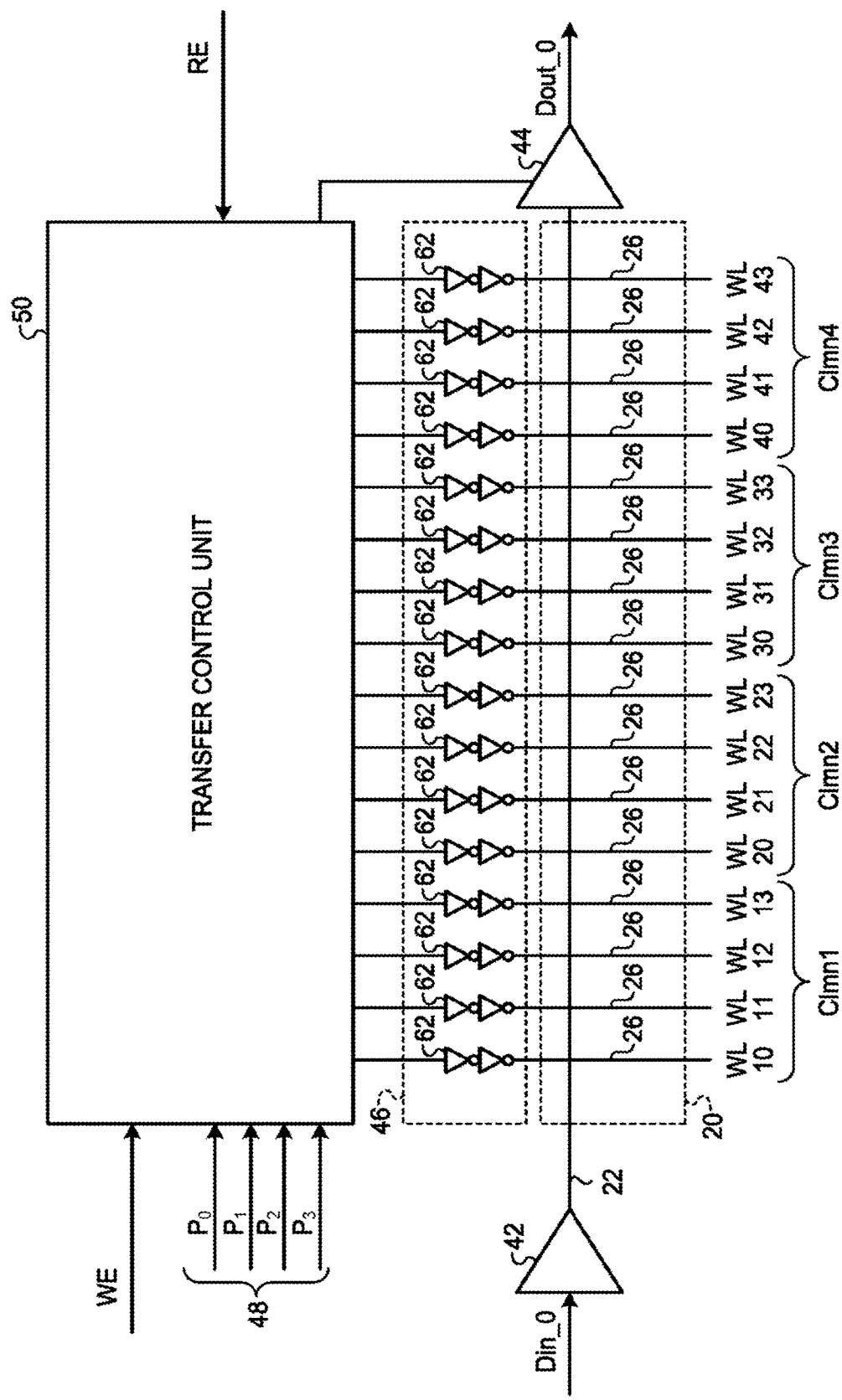
FIG. 13 is a diagram illustrating a configuration of a driver.

FIG. 13 is a diagram illustrating a circuit configuration of the driver 46 in a case where the number of the second interconnections 26 is 16, the number of columns is 4, and the four-phase driving is performed, along with the memory unit 20, the injector 42, the detector 44, and the transfer controller 50.

The driver 46 includes a plurality of drive circuit 62. The drive circuits 62 correspond to the second interconnections 26 in a one-to-one relation. Each of the drive circuits 62 receives a control signal from the transfer controller 50 and applies a voltage according to the received control signal to the corresponding second interconnection 26.

Figure 14:
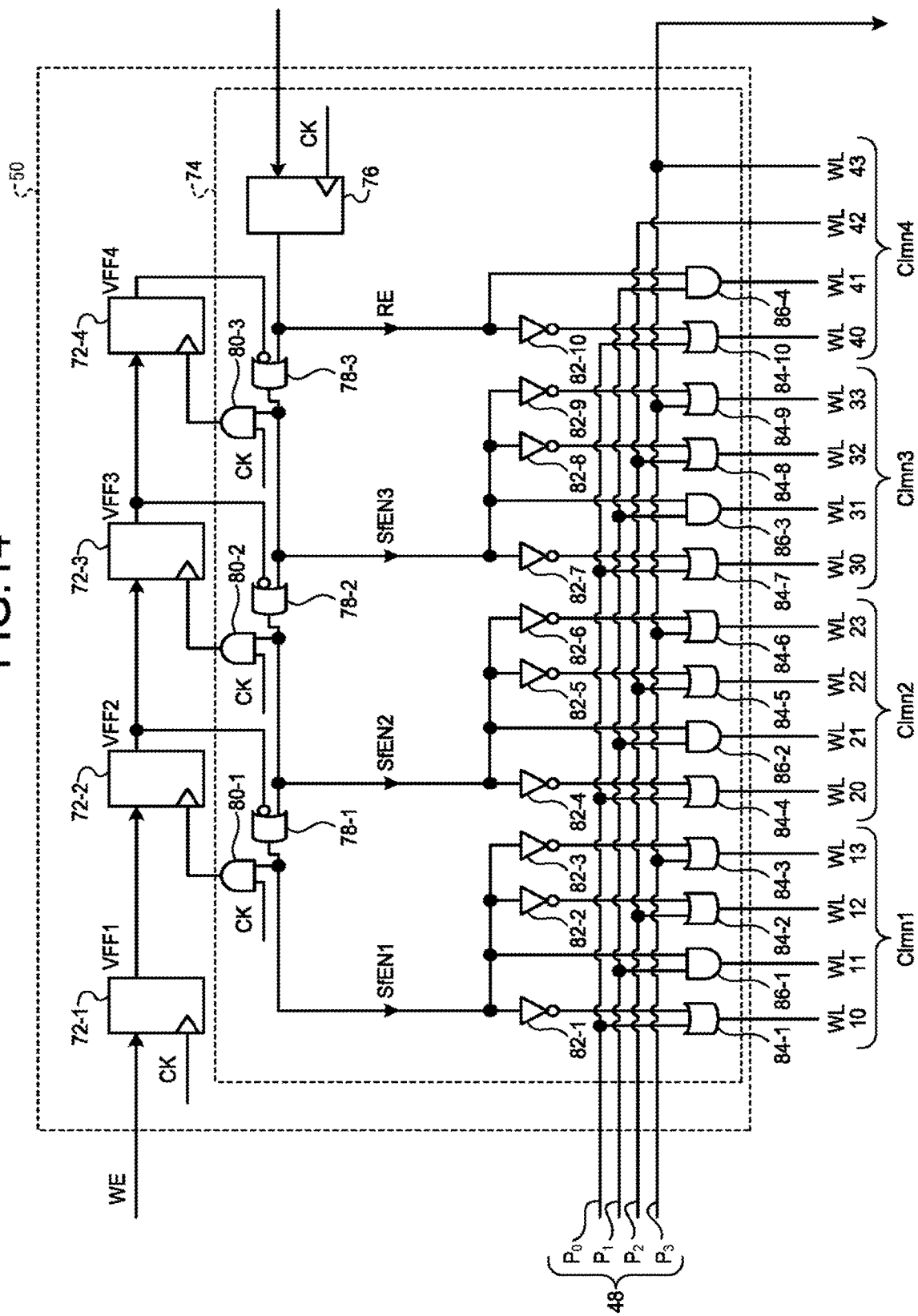
FIG. 14 is a diagram illustrating a circuit configuration of a transfer controller.

FIG. 14 is a diagram illustrating a circuit configuration of the transfer controller 50 in a case where the number of the second interconnections 26 is 16, the number of columns is 4, and the four-phase driving is performed.

The transfer controller 50 includes a first flag storage a second flag storage 72-2, a third flag storage 72-3, and a fourth flag storage 72-4. The first to fourth storages 72-1 to 72-4 are examples of the flag storages 72.

The first flag storage 72-1 stores therein a flag indicating whether charges held in a first column (Clmn1) are valid. The second flag storage 72-2 stores therein a flag indicating whether charges held in a second column (Clmn2) are valid. The third flag storage 72-3 stores therein a flag indicating whether charges held in a third column (Clmn3) are valid. The fourth flag storage 72-4 stores therein a flag indicating whether charges held in a fourth column (Clmn4) are valid.

The first flag storage 72-1 acquires a write enable signal (WE) at a timing of a clock signal (CK). The second flag storage 72-2 acquires the flag stored in the first flag storage 72-1 in response to a first transfer signal (SfEN1) from the controller 74. The third flag storage 72-3 acquires the flag stored in the second flag storage 72-2 in response to a second transfer signal (SfEN2) from the controller 74. The fourth flag storage 72-4 acquires the flag stored in the third flag storage 72-3 in response to a third transfer signal (SfEN3) from the controller 74.

The controller 74 includes an enable storage 76. The enable storage 76 acquires a read enable signal (RE) at a timing of the clock signal (CK).

The controller 74 also includes a first transfer permission unit 78-1, a second transfer permission unit 78-2, a third transfer permission unit 78-3, a first synchronization unit 80-1, a second synchronization unit 80-2, and a third synchronization unit 80-3.

The third transfer permission unit 78-3 sets the third transfer signal (SfEN3) to H logic in a case where the read enable signal (RE) has H logic or a case where the flag stored in the fourth flag storage 72-4 has L logic, and sets the third transfer signal (SfEN3) to L logic in other cases. The third synchronization unit 80-3 synchronizes the third transfer signal (SfEN3) with the clock signal (CR) and supplies the synchronized third transfer signal (SfEN3) to the fourth flag storage 72-4. This enables the fourth flag storage 72-4 to acquire the flag stored in the third flag storage 72-3 in a case where the read enable signal (RE) has H logic or a case where valid charges are not held in the fourth column.

The second transfer permission unit 78-2 sets the second transfer signal (SfEN2) to H logic in a case where the third transfer signal (SfEN3) has H logic or a case where the flag stored in the third flag storage 72-3 has L logic, and sets the second transfer signal (SfEN2) to L logic in other cases. The second synchronization unit 80-2 synchronizes the second transfer signal (SfEN2) with the clock signal (CK) and supplies the synchronized second transfer signal (SfEN2) to the third flag storage 72-3. Accordingly, the third flag storage 72-3 can acquire the flag stored in the second flag storage 72-2 in a case where the read enable signal (RE) has H logic or a case where no valid charges are held in the third column or the fourth column.

The first transfer permission unit 78-1 sets the first transfer signal (SfEN1) to H logic in a case where the second transfer signal (SfEN2) has H logic or a case where the flag stored in the second flag storage 72-2 has L logic, and sets the first transfer signal (SfEN1) to L logic in other cases. The first synchronization unit 80-1 synchronizes the first transfer signal (SfEN1) with the clock signal (CK) and supplies the synchronized first transfer signal (SfEN1) to the second flag storage 72-2. This enables the second flag storage 72-2 to acquire the flag stored in the first flag storage 72-1 in a case where the read enable signal (RE) has H logic or a case where no valid charges are held in at least one of the second column, the third column, and the fourth column.

The first flag storage stores therein the flag of H logic in a case where the write enable signal (WE) has H logic and stores therein the flag of L logic in a case where the write enable signal (WE) has L logic. Accordingly, the first flag storage 72-1 can set the flag stored in the first flag storage 72-1 to H logic in a case where valid charges are held in the first column.

According to the foregoing processes, the controller 74 can move the flags stored in the flag storages 72 corresponding to columns other than the last column (the fourth column) to the flag storages 72 corresponding to columns adjacent in the direction to the terminal end when receiving a read enable signal. The controller 74 can cause the flag storages 72 to perform the forward filling processing when a read enable signal is not received and a flag indicating that charges are not valid is stored in any of the flag storages 72.

The controller 74 further includes a first inverter a second inverter 82-2, a third inverter 82-3, a first OR circuit 84-1, a second OR circuit 84-2, a third OR circuit 84-3, and a first AND circuit 86-1.

The first inverter 82-1, the second inverter 82-2, and the third inverter 82-3 invert the logic of the first transfer signal (SfEN1).

The first OR circuit 84-1 supplies a signal obtained by performing an OR operation between the pattern signal ($P_0$) of a zeroth phase and an inverted first transfer signal (SfEN1) to the drive circuit 62 that drives a word line (WL10) of the zeroth phase in the first column. The first AND circuit 86-1 supplies a signal obtained by performing an AND operation between the pattern signal ($P_1$) of a first phase and the first transfer signal (SfEN1) to the drive circuit 62 that drives a word line (WL11) of the first phase in the first column. The second OR circuit 84-2 supplies a signal obtained by performing an OR operation between the pattern signal ($P_2$) of a second phase and the inverted first transfer signal (SfEN1) to the drive circuit 62 that drives a word line (WL12) of the second phase in the first column. The third OR circuit 84-3 supplies a signal obtained by performing an OR operation between the pattern signal ($P_3$) of a third phase and the inverted first transfer signal (SfEN1) to the drive circuit 62 that drives a word line (WL13) of the third phase in the first column.

Accordingly, the controller 74 can transfer the charge held in the first column to the second column in a case where the read enable signal (RE) has H logic or a case where no valid charges are held in at least one of the second column, the third column, and the fourth column, and can cause the first column to hold the charges held therein in other cases. An operation to hold charges indicates an operation of each column to hold the charges held therein as they are until the next transfer cycle.

The controller 74 further includes a fourth inverter 82-4, a fifth inverter 82-5, a sixth inverter 82-6, a fourth OR circuit 84-4, a fifth OR circuit 84-5, a sixth OR circuit 84-6, and a second AND circuit 86-2.

The fourth inverter 82-4, the fifth inverter 82-5, and the sixth inverter 82-6 invert the logic of the second transfer signal (SfEN2).

The fourth OR circuit 84-4 supplies a signal obtained by performing an OR operation between the pattern signal ($P_0$) of the zeroth phase and the inverted second transfer signal (SfEN2) to the drive circuit 62 that drives a word line (WL20) of the zeroth phase in the second column. The second AND circuit 86-2 supplies a signal obtained by performing an AND operation between the pattern signal ($P_1$) of the first phase and the second transfer signal (SfEN2) to the drive circuit 62 that drives a word line (WL21) of the first phase in the second column. The fifth OR circuit 84-5 supplies a signal obtained by performing an OR operation between the pattern signal ($P_2$) of the second phase and the inverted second transfer signal (SfEN2) to the drive circuit 62 that drives a word line (WL22) of the second phase in the second column. The sixth OR circuit 84-6 supplies a signal obtained by performing an OR operation between the pattern signal ($P_3$) of the third phase and the inverted second transfer signal (SfEN2) to the drive circuit 62 that drives a word line (WL23) of the third phase in the second column.

This enables the controller 74 to transfer charges held in the second column to the third column in a case where the read enable signal (RE) has H logic or a case where no valid charges are held in at least either the third column or the fourth column, and to cause the second column to hold the charges held therein in other cases.

The controller 74 further includes a seventh inverter 82-7, an eighth inverter 82-8, a ninth inverter 82-9, a seventh OR circuit 84-7, an eighth OR circuit 84-8, a ninth OR circuit 84-9, and a third AND circuit 86-3.

The seventh inverter 82-7, the eighth inverter 82-2, and the ninth inverter 82-9 invert the logic of the third transfer signal (SfEN3).

The seventh OR circuit 84-7 supplies a signal obtained by performing an OR operation between the pattern signal ($P_0$) of the zeroth phase and the inverted third transfer signal (SfEN3) to the drive circuit 62 that drives a word line (WL30) of the zeroth phase in the third column. The third AND circuit 86-3 supplies a signal obtained by performing an AND operation between the pattern signal ($P_1$) of the first phase and the third transfer signal (SfEN3) to the drive circuit 62 that drives a word line (WL31) of the first phase in the third column. The eighth OR circuit 84-8 supplies a signal obtained by performing an OR operation between the pattern signal ($P_2$) of the second phase and the inverted third transfer signal (SfEN3) to the drive circuit 62 that drives a word line (WL32) of the second phase in the third column. The ninth OR circuit 84-9 supplies a signal obtained by performing an OR operation between the pattern signal ($P_3$) of the third phase and the inverted third transfer signal (SfEN3) to the drive circuit 62 that drives a word line (WL33) of the third phase in the third column.

This enables the controller 74 to transfer charges held in the third column to the fourth column in a case where the read enable signal (RE) has H logic or a case where no valid charges are held in the fourth column, and to cause the third column to hold the charges held therein in other cases.

The controller 74 further includes a tenth inverter 82-10, a tenth OR circuit 84-10, and a fourth AND circuit 86-4.

The tenth inverter 82-10 inverts the logic of the read enable signal (RE).

The tenth OR circuit 84-10 supplies a signal obtained by performing an OR operation between the pattern signal ($P_0$) of the zeroth phase and the inverted read enable signal (RE) to the drive circuit 62 that drives a word line (WL40) of the zeroth phase in the fourth column. The fourth AND circuit 86-4 supplies a signal obtained by performing an AND operation between the pattern signal ($P_1$) of the first phase and the read enable signal (RE) to the drive circuit 62 that drives a word line (WL41) of the first phase in the fourth column.

The pattern signal ($P_2$) of the second phase is supplied to the drive circuit 62 that drives a word line (WL42) of the second phase in the fourth column. The pattern signal ($P_3$) for the third pattern is supplied to the drive circuit 62 that drives a word line (WL43) of the third phase in the fourth column.

Accordingly, when the read enable signal (RE) has H logic, the controller 74 can supply charges held in the fourth column to the detector 44.

According to the foregoing processes, the controller 74 can move charges held in each of columns other than the last column (the fourth column) to a column adjacent in the direction to the terminal end when receiving a read enable signal. The controller 74 can perform forward filling processing to a plurality of columns when the controller 74 has not received the read enable signal and a flag indicating that the charges are not valid is stored in any of the flag storages 72.

Figure 15:
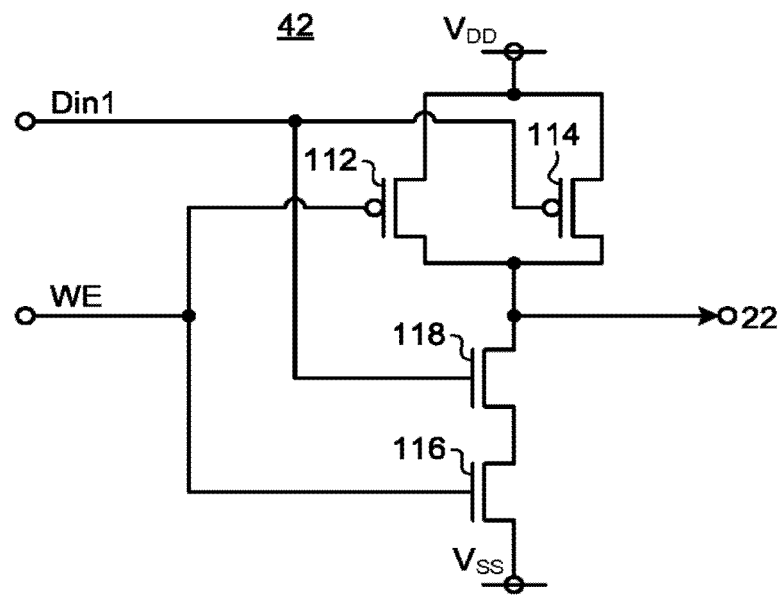
FIG. 15 is a diagram illustrating a circuit configuration of an injector.

FIG. 15 is a diagram illustrating an example of a circuit configuration of the injector 42. The injector 42 includes a first p-MOS transistor 112, a second p-MOS transistor 114, a first n-MOS transistor 116, and a second n-MOS transistor 118.

The first p-MOS transistor 112 has a source connected to a positive power-supply potential ($V_{DD}$), a drain connected to the start end of the corresponding first interconnection 22, and a gate to which a write enable signal (WE) is applied. The second p-MOS transistor 114 has a source connected to the positive power-supply potential ($V_{DD}$), a drain connected to the start end of the corresponding first interconnection 22, and a gate to which input data (Din1) is applied.

The first n-MOS transistor 116 has a source connected to a negative power-supply potential ($V_{SS}$) (a ground potential, for example), a drain connected to a source of the second n-MOS transistor 118, and a gate to which the write enable signal (WE) is applied. The second n-MOS transistor 118 has the source connected to the drain of the first n-MOS transistor 116, a drain connected to the start end of the corresponding first interconnection 22, and a gate to which the input data (Din1) is applied.

In the injector 42 described above, the positive power-supply potential ($V_{DD}$) is applied the start end of the corresponding first interconnection 22 when at least either the input data (Din1) or the write enable signal (WE) has L logic. Further, in the injector 42, the negative power-supply potential ($V_{SS}$) (the ground potential, for example) is applied to the start end of the corresponding first interconnection 22 when both the input data (Din1) and the write enable signal (WE) have H logic.

Accordingly, the injector 42 can inject negative charges to the start end of the corresponding first interconnection 22 when both the input data (Din1) and the write enable signal (WE) have H logic. The injector 42 can extract negative charges from the start end of the corresponding first interconnection 22 when either the input data (Din) or the write enable signal (WE) has L logic.

Figure 16:
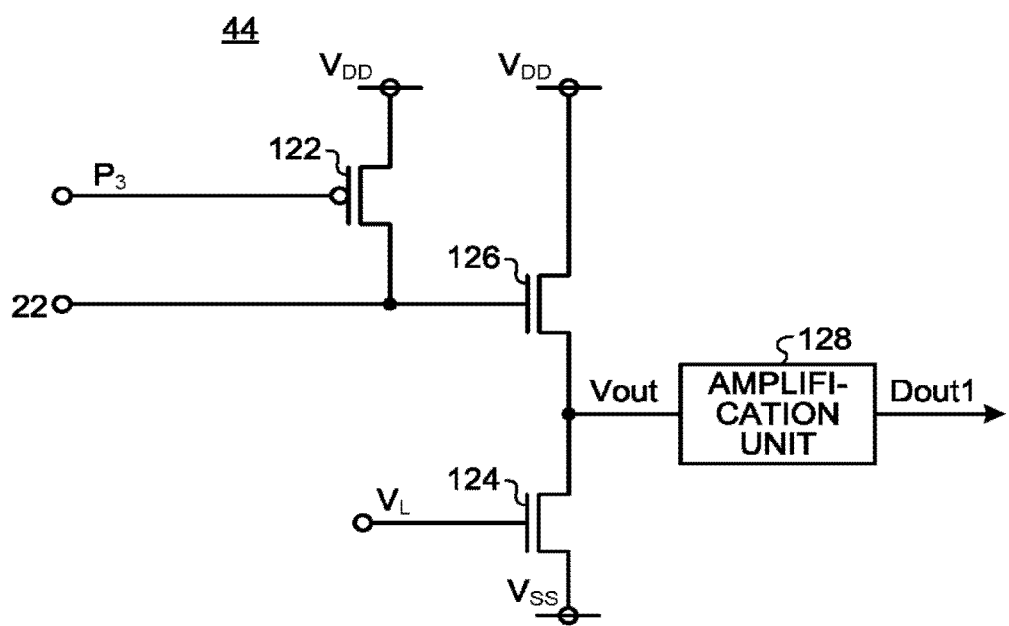
FIG. 16 is a diagram illustrating a circuit configuration of a detector.

FIG. 16 is a diagram illustrating an example of a circuit configuration of the detector 44. The detector 44 include a third p-MOS transistor 122, a third n-MOS transistor 124, a fourth n-MOS transistor 126, and an amplifier 128.

The third p-MOS transistor 122 has a source connected to the positive power-supply potential ($V_{DD}$), a drain connected to the terminal end of the corresponding first interconnection 22, and a gate to which the pattern signal ($P_3$) of the third phase is applied. The third p-MOS transistor 122 described above can extract charges from the terminal end of the corresponding first interconnection 22 to empty the charges accumulated in the terminal end of the corresponding first interconnection 22 at a timing when the pattern signal (P) of the third phase has L logic.

The third n-MOS transistor 124 has a source connected to the negative power-supply potential ($V_{SS}$) (the ground potential, for example), a drain connected to an input end of the amplifier 128, and a gate to which an output control signal ($V_L$) is applied. The fourth n-MOS transistor 126 has a source connected to the positive power-supply potential ($V_{DD}$), a drain connected to the input end of the amplifier 128, and a gate connected to the terminal end of the corresponding first interconnection 22. The amplifier 128 amplifies a voltage (Vout) of a connection point between the third n-MOS transistor 124 and the fourth n-MOS transistor 126 and outputs output data (Dout1).

Accordingly, when negative charges are accumulated in the terminal end of the corresponding first interconnection 22, the detector 44 generates a voltage (Vout) according to the charge quantity of the negative charges and outputs the output data (Dout1) according to the generated voltage (Vout). For example, the detector 44 outputs the output data (Dout1) of H logic when negative charges are accumulated in the terminal end of the corresponding first interconnection 22, and outputs the output data (Dout1) of L logic when negative charges are not accumulated therein.

Figure 17:
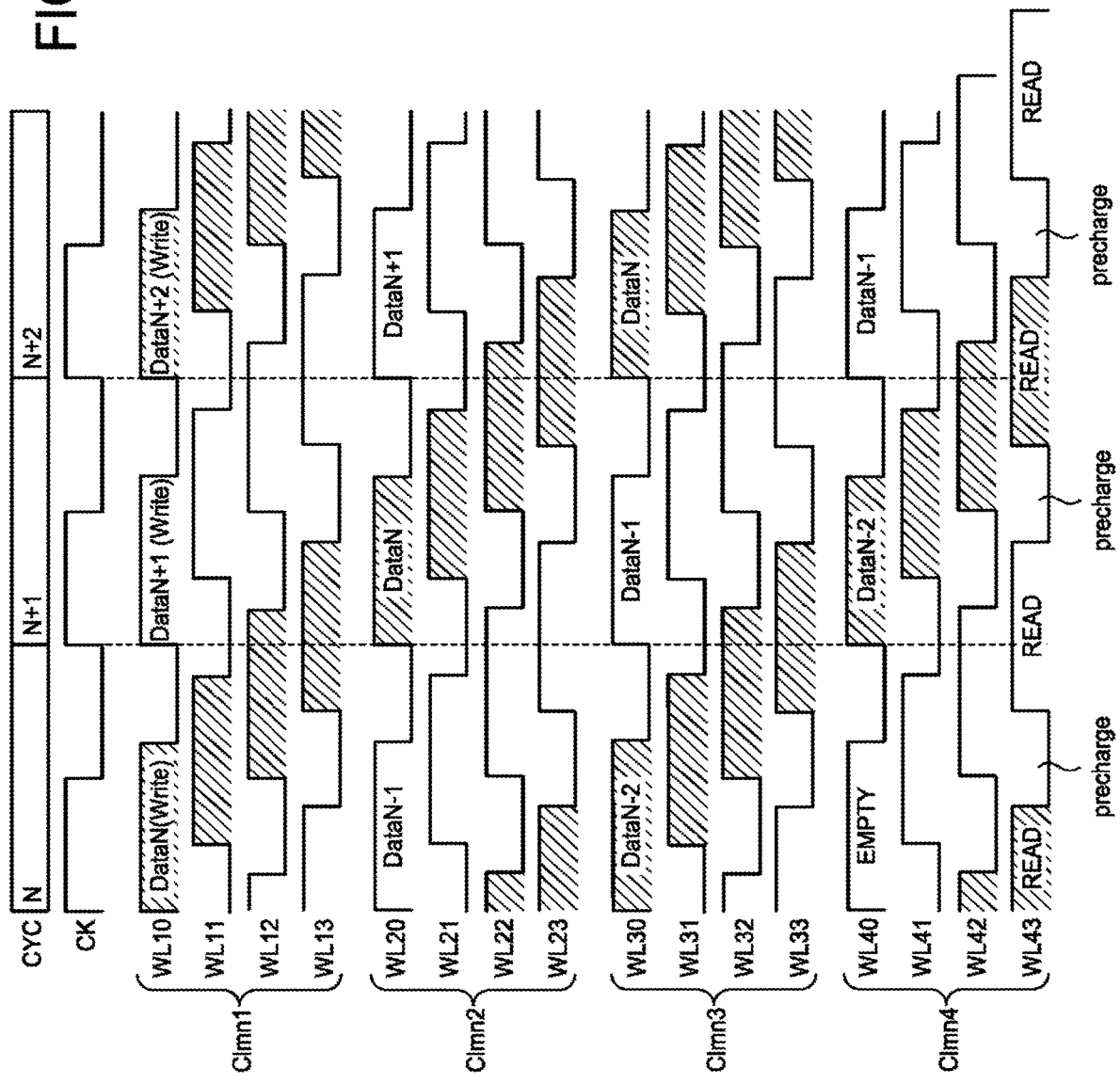
FIG. 17 is a diagram illustrating a first example of voltage patterns to be applied to a plurality of second interconnections.
Figure 18:
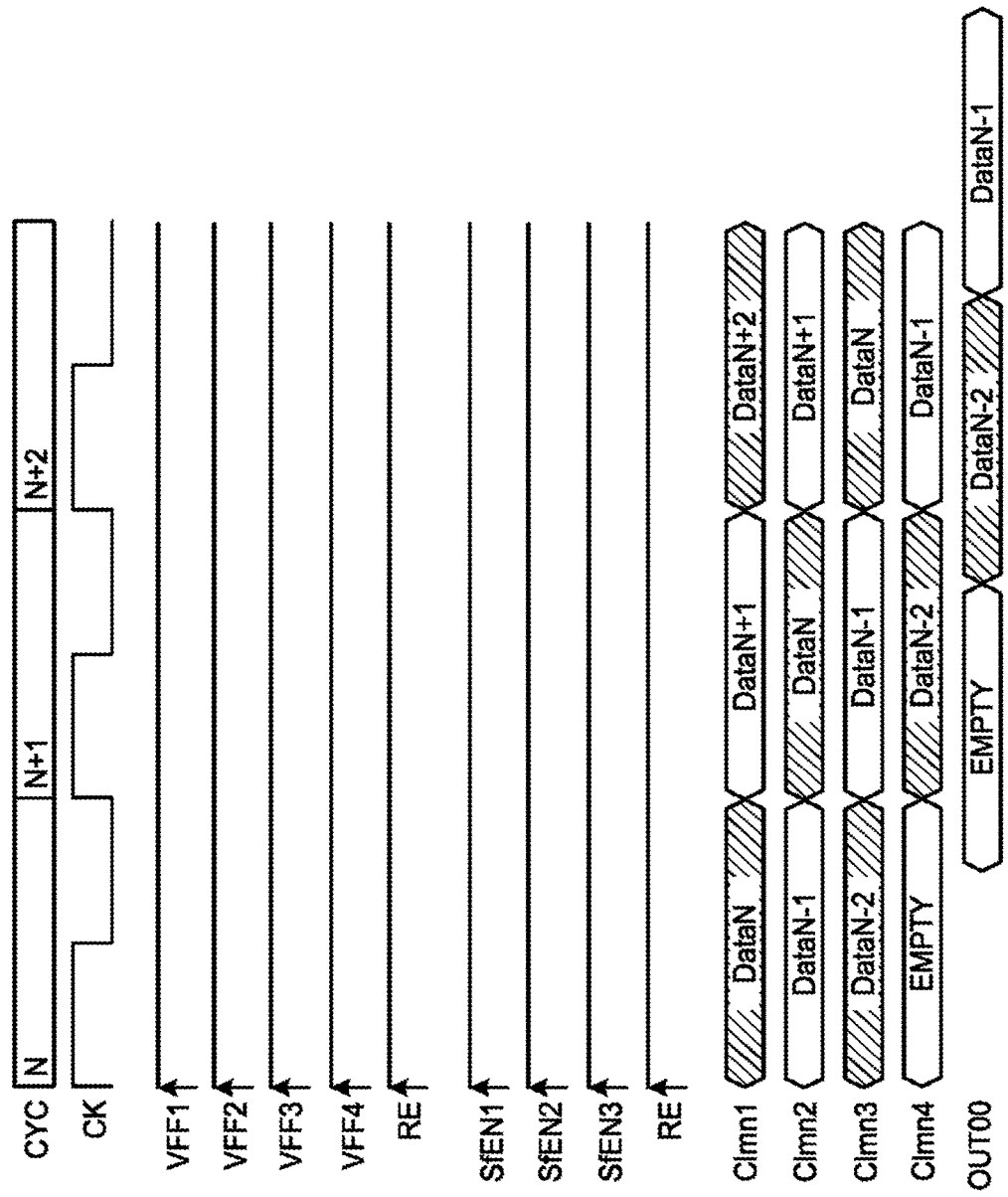

FIG. 17 is a diagram illustrating voltage patterns to be applied to the second interconnections 26 when a read enable signal is received. FIG. 18 is a diagram illustrating waveforms of signals in the controller 74 and data held in respective columns when the voltage patterns as illustrated in FIG. 17 are applied.

In FIGS. 17 and 18, CYC indicates transfer cycle numbers. CK indicates a waveform of the clock signal. WL10 to WL43 indicate voltage patterns to be applied to the second interconnections 26, respectively. VFF1 to VFF4 indicate flags stored in the first to fourth flag storages 72-1 to 72-4, respectively. RE indicates a value of the read enable signal stored in the enable storage 76. SfEN1 to SfEN3 indicate the first to third transfer signals, respectively. Clmn1 to Clmn4 indicate data held in the first to fourth columns, respectively. OUT00 indicates output data. The same holds for FIGS. 19 and 20.

In the examples illustrated in FIGS. 17 and 18, the read enable signal has H logic at an Nth cycle, an (N+1)th cycle, and an (N+2)th cycle. In this case, the controller 74 enables charges held in the fourth column to be read by the detector 44 at the Nth cycle, the (N+1)th cycle, and the (N+2)th cycle. Further, at the Nth cycle, the (N+1)th cycle, and the (N+2)th cycle, the controller 74 transfers charges held in the first column to the second column, transfers charges held in the second column to the third column, and transfers charges held in the third column to the fourth column.

In the examples illustrated in FIGS. 17 and 18, the fourth column does not have valid charges held therein at the Nth cycle. Therefore, the detector 44 does not output valid data at the Nth cycle. However, the fourth column has valid charges held therein at the (N+1)th cycle and the (N+2)th cycle. Therefore, the detector 44 can output valid data at the (N+1)th cycle and the (N+2)th cycle.

Figure 19:
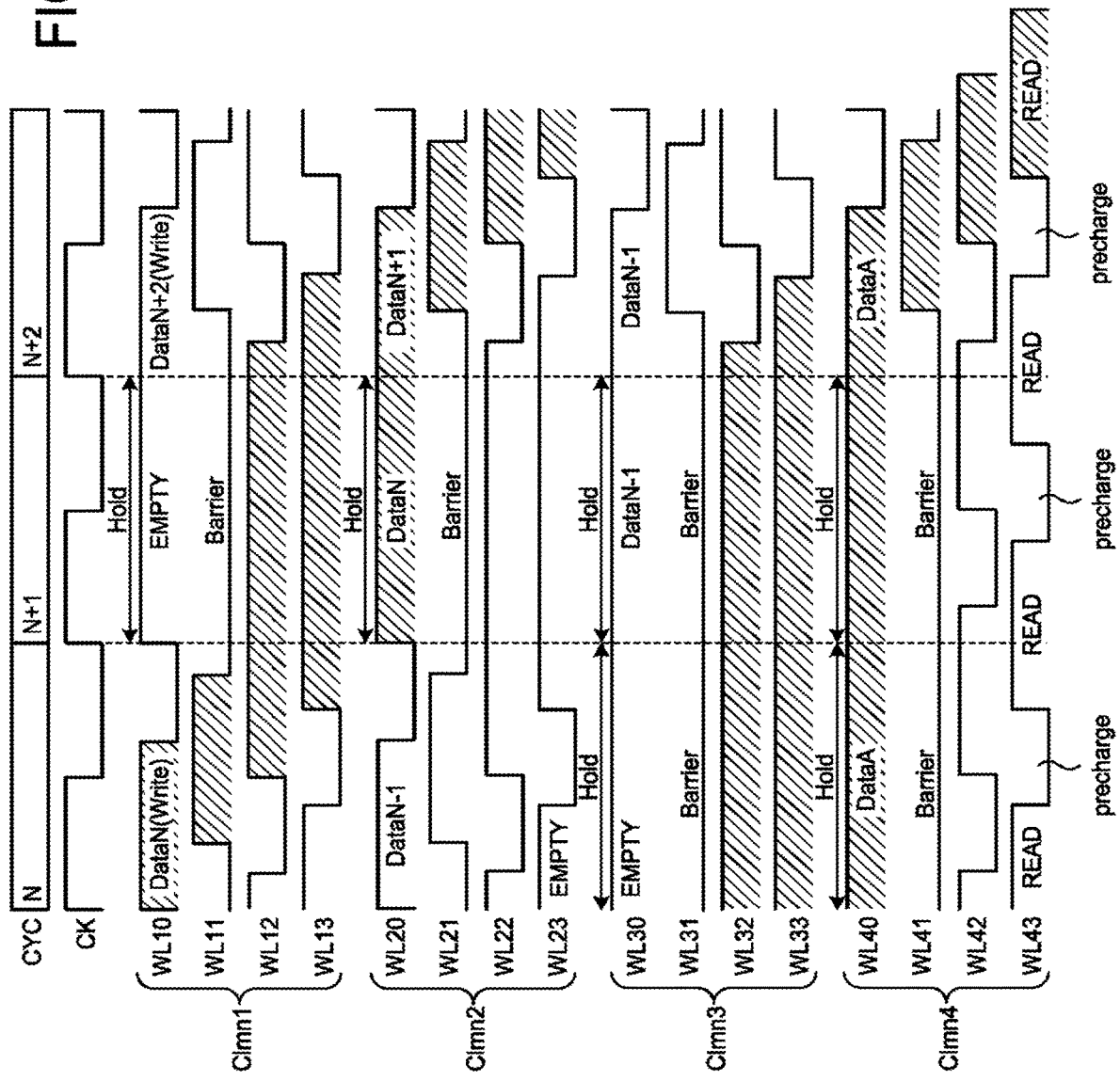
FIG. 19 is a diagram illustrating a second example of voltage patterns to be applied to a plurality of second interconnection.
Figure 20:
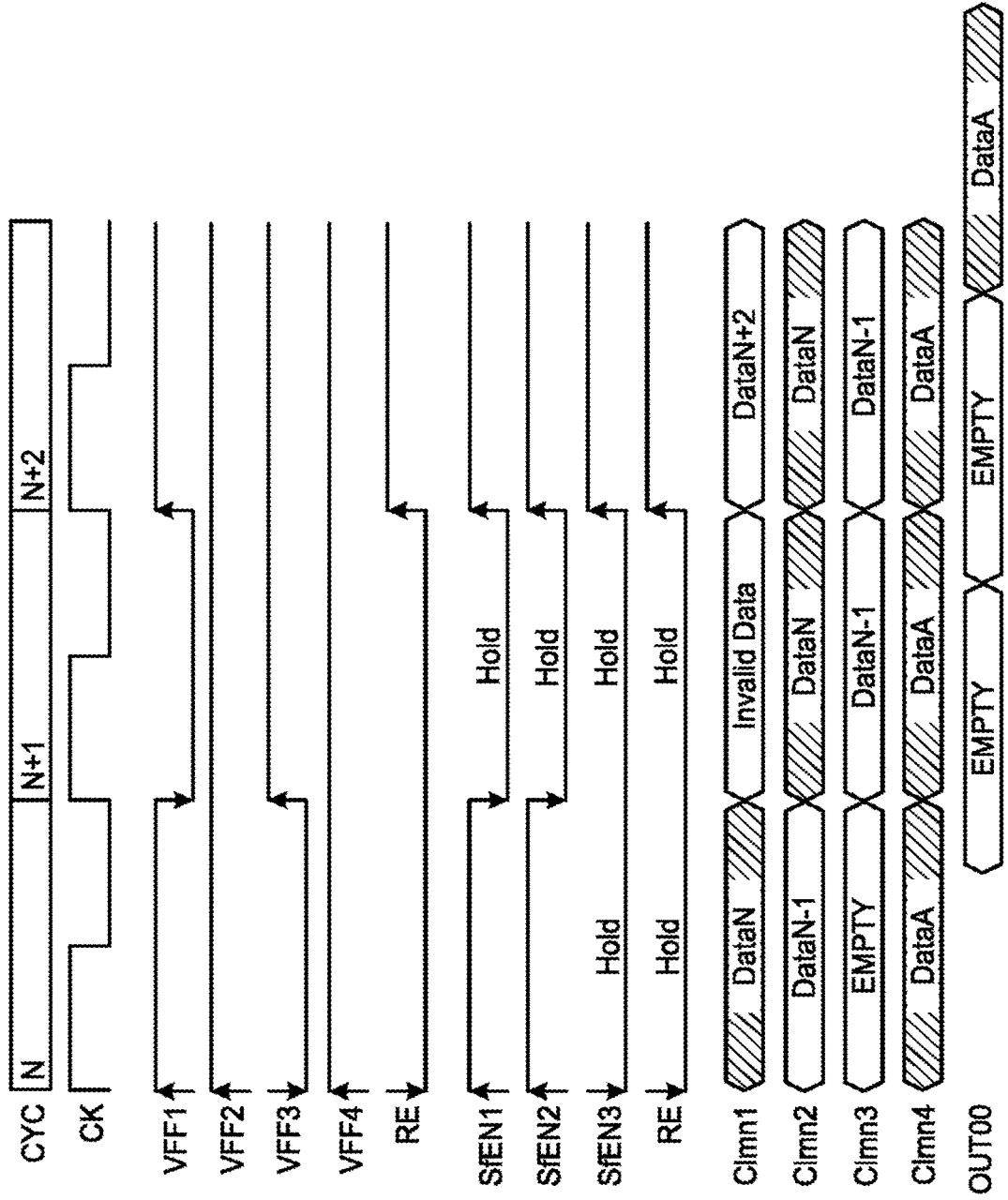
FIG. 20 is a diagram illustrating a second example of waveforms of signals in the controller.

FIG. 19 is a diagram illustrating voltage patterns to be applied to the second interconnections 26 when a read enable signal is not received. FIG. 20 is a diagram illustrating waveforms of signals in the controller 74 and data held in respective columns when the voltage patterns as illustrated in FIG. 19 are applied.

In the examples illustrated in FIGS. 19 and 20, the read enable signal has L logic at an Nth cycle. The third column does not have valid charges held therein at the Nth cycle. In this case, the controller 74 prevents charges held in the fourth column from being read by the detector 44 at the Nth cycle. At the Nth cycle, the controller 74 applies voltages to the second interconnections 26 to transfer charges in the first column to the second column, to transfer charges in the second column to the third column, and to hold the charges in the fourth column.

In the examples illustrated in FIGS. 19 and 20, the read enable signal has L logic at an (N+1)th cycle The first to fourth columns have valid charges held therein at the (N+1)th cycle. In this case, at the (N+1)th cycle, the controller 74 prevents the charges held in the fourth column from being read by the detector 44. Further, the controller 74 applies voltages to the second interconnections 26 to hold all the charges in the first to fourth columns at the (N+1)th cycle.

In the examples illustrated in FIGS. 19 and 20, the read enable signal has H logic at an (N+2)th cycle. In this case, the controller 74 enables the charges held in the fourth column to be read by the detector 44 at the (N+2)th cycle.

Further, at the (N+2)th cycle, the controller 74 transfers the charges in the first column to the second column, transfers the charges in the second column to the third column, and transfers the charges in the third column to the fourth column.

As described above, the memory device 10 according to the present embodiment can realize a FIFO memory of a charge transfer type that transfers charges in an oxide semiconductor with quite small off-leakage. The FIFO memory of the charge transfer type can store charges of one data sample in a quite small area (2F×8F in the case of the four-phase driving) (F is a unit of semiconductor downscaling). With the memory device 10 according to the present embodiment, the storage capacity per area can be increased.

Figure 21:
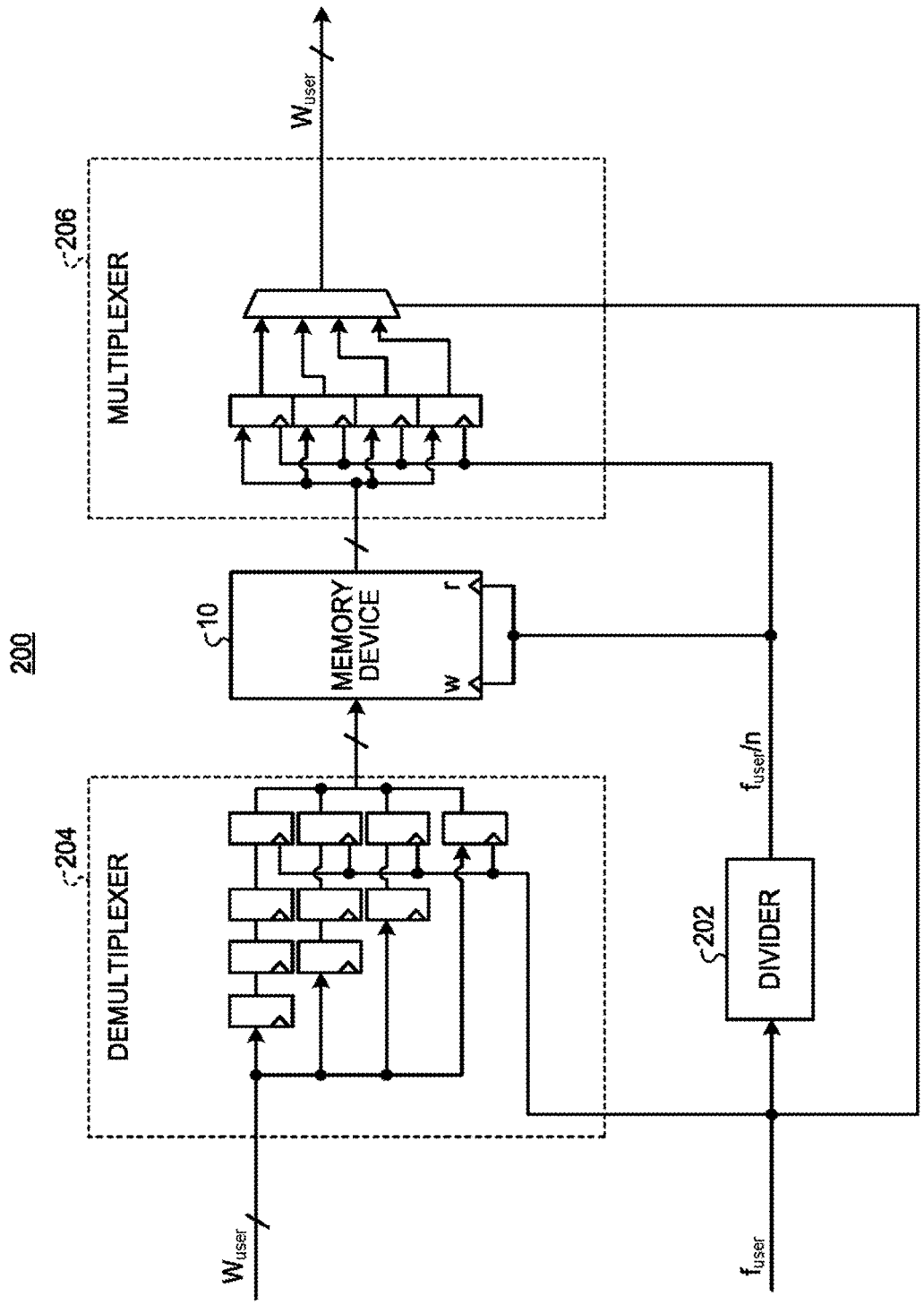
FIG. 21 is a diagram illustrating a configuration of a semiconductor device according to a first modification.

FIG. 21 is a diagram illustrating a configuration of a semiconductor device 200 according to a first modification. The semiconductor device 200 according to the first modification includes the memory device 10, a divider 202, a demultiplexer 204, and a multiplexer 206.

The semiconductor device 200 according to the first modification is a FIFO memory that acquires a serial data string with a bit width Wuser synchronized with a first frequency (fuser), temporarily stores therein the serial data string, and outputs the stored data in the inputting order in synchronization with the first frequency (fuser).

The memory device 10 has an identical configuration to that explained with reference to FIGS. 1 to 20. The divider 202 generates a clock of a second frequency (fuser/n) by dividing the first frequency (fuser) by n (n is an integer equal to or larger than 2). The number of the injectors 42 in the memory device 10 is larger than the bit width (Wuser) of the input serial data and is Wuser×n, for example.

The demultiplexer 204 time-divides the serial data synchronized with the clock of the first frequency (fuser) into n pieces of parallel input data. The demultiplexer 204 distributes the n pieces of parallel input data (the total number of bits thereof is Wuser×n) to the (Wuser×n) injectors 42 in the memory device 10, respectively.

Each of the (Wuser×n) injectors 42 in the memory device 10 acquires corresponding input data in synchronization with the clock of the second frequency (fuser/n). Each of the (Wuser×n) injectors 42 injects charges according to the acquired input data to the start end of the corresponding first interconnection 22 in synchronization with the clock of the second frequency (fuser/n).

The transfer controller 50 in the memory device 10 moves the charges injected to the start ends of the (Wuser×n) first interconnections 22 in the direction to the terminal ends in synchronization with the clock of the second frequency (fuser/n).

Each of the detectors 44 in the memory device 10 acquires (Wuser×n) charges held in the terminal end of the corresponding first interconnection 22 and outputs output data according to the acquired charges in synchronization with the clock of the second frequency (fuser/n).

The multiplexer 206 retrieves plural pieces of output data output from the detectors 44 in synchronization with the clock of the second frequency (fuser/n) and time-multiplexes the pieces of output data to generate one serial data string with the bit width (Wuser) synchronized with the clock of the first frequency (fuser). The multiplexer 206 then outputs the generated serial data string.

The semiconductor device 200 according to the first modification can store a serial data string synchronized with a high-speed clock (fuser) using the memory device 10 that operates in accordance with a low-speed clock (fuser/n).

The semiconductor device 200 can have a configuration including only either the demultiplexer 204 or the multiplexer 206. The multiplexer 206 can operate asynchronously with the first frequency (fuser). In this case, the multiplexer 206 time-multiplexes the plural pieces of output data output from the detectors 44 in synchronization with a clock of a third frequency into one piece of data synchronized with a clock of a fourth frequency obtained by multiplying the third frequency by m (m is an integer equal to or larger than 2). The multiplexer 206 then outputs the time-multiplexed data.

The semiconductor device 200 can include a plurality of the memory devices 10 between the demultiplexer 204 and the multiplexer 206. For example, the semiconductor device 200 can include the memory devices 10 connected in series. Alternatively, the semiconductor device 200 can include the memory devices 10 connected in parallel.

Figure 22:
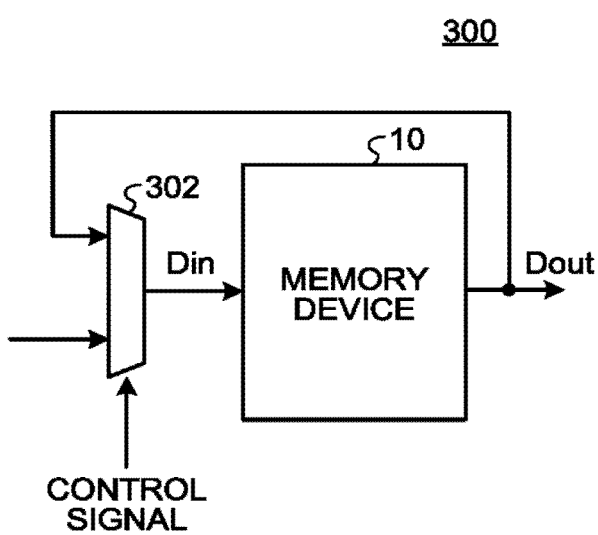
FIG. 22 is a diagram illustrating a configuration of a semiconductor device according to a second modification.

FIG. 22 is a diagram illustrating a configuration of a semiconductor device 300 according to a second modification. The semiconductor device 300 according to the second modification includes the memory device 10 and a switching unit 302.

The memory device 10 has an identical configuration to that explained with reference to FIGS. 1 to 20. The switching unit 302 selects either data received from outside (a circuit at a previous stage of the semiconductor device 300, for example) or output data of the memory device 10 in response to a control signal. The switching unit 302 provides the corresponding injector 42 in the memory device 10 with the selected data as input data.

Accordingly, the switching unit 302 can store the data output from the memory device 10 in the memory device 10 again. Therefore, the semiconductor device 300 according to the second modification can continue to store therein data repeatedly even after the data is read. The semiconductor device 300 according to the second modification can periodically refresh charges and store data for a long time.

The semiconductor device 300 can include a plurality of the memory devices 10. For example, the semiconductor device 300 can include the memory devices 10 connected in series. Alternatively, the semiconductor device 300 can include the memory devices 10 connected in parallel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a plurality of first interconnections that are oxide semiconductors formed in parallel at predetermined intervals in a first direction on a first layer;
    a plurality of gate dielectric films that are formed on surfaces of the first interconnections, respectively;
    a plurality of second interconnections that are conductors formed at predetermined intervals in parallel to a second direction on the first layer on which the first interconnections are formed, the second interconnections bridging over the gate dielectric films, the second direction being parallel to the first layer and being orthogonal to the first direction;

a plurality of charge injectors that are provided to correspond to the first interconnections in a one-to-one relation;

a transfer controller configured to control voltages to be applied to the second interconnections to move charges injected to respective start ends of the first interconnections in a direction toward a terminal end being an opposite end to a start end; and a plurality of detectors that are provided to correspond to the first interconnections in a one-to-one relation, wherein each of the charge injectors is configured to inject charges to the start end of a corresponding one of the first interconnections according to input data, and each of the detectors is configured to extract charges held in the terminal end of a corresponding one of the first interconnections and output data according to the extracted charges.

2. The device according to claim 1, wherein each of the first interconnections is divided into a plurality of columns in the first direction, each of the columns is a region corresponding to a predetermined number of second interconnections and holds therein charges corresponding to data of one sample, the predetermined number being larger than or equal to 2, each of the charge injectors is configured to inject charges corresponding to input data of one sample to a top column placed on the start end of a corresponding one of the first interconnections, and each of the detectors is configured to extract charges corresponding to output data of one sample from a last column placed on the terminal end of a corresponding one of the first interconnections.

3. The device according to claim 2, wherein the transfer controller is configured to move charges held in each column to a column adjacent in a direction toward the terminal end when charges are extracted from the last column.

4. The device according to claim 3, wherein the transfer controller includes a plurality of flag storages that are provided to correspond to the columns in a one-to-one relation, and a controller, each of the flag storages is configured to store therein a flag indicating whether charges held in a corresponding one of the columns are valid, a flag indicating that charges are valid is written to one of the flag storages corresponding to the top column when charges according to valid input data are injected to the top column, and when charges are extracted from the last column, the controller is configured to move charges held in respective columns to columns adjacent in a direction to the terminal end, and move flags stored in ones of the flag storages corresponding to the respective columns to ones of the flag storages corresponding to the columns adjacent in the direction to the terminal end.

5. The device according to claim 4, wherein when a flag indicating that charges are not valid is stored in any of the flag storages, the controller is configured to move charges held in columns closer to the start end than a column corresponding to the flag storage in which the flag indicating that charges are not valid is stored, to columns adjacent in the direction to the terminal end, and move flags stored in ones of the flag storages corresponding to the columns closer to the start end than the column corresponding to the flag storage in which the flag indicating that charges are not valid is stored, to ones of the flag storages corresponding to the columns adjacent in the direction to the terminal end.

6. The semiconductor device according to claim 1, further comprising a demultiplexer configured to time-divide a serial data string with a bit width W input in synchronization with a clock of a first frequency into n pieces of parallel input data, and distribute the n pieces of input data to (W×n) charge injectors, respectively, where n is an integer larger than or equal to 2, wherein the transfer controller is configured to move charges injected into the start end of each of the first interconnections in synchronization with a clock of a second frequency that is obtained by dividing the first frequency by n.

7. The device according to claim 1, further comprising a multiplexer configured to time-multiplex plural pieces of output data output from the detectors in synchronization with a clock of a third frequency to generate serial data synchronized with a clock of a fourth frequency that is obtained by multiplying the third frequency by m and outputs the generated serial data, where m is an integer larger than or equal to 2.

8. The device according to claim 1, further comprising a switching unit configured to select either data received from outside or output data output from a corresponding one of the detectors, and provide a corresponding one of the charge injectors with the selected data as input data in response to a control signal.

9. The device according to claim 1, further comprising a substrate, wherein the first interconnections are formed on the substrate, and the substrate includes a semiconductor circuit that functions as the charge injectors, the transfer controller, and the detectors.

10. The device according to claim 1, further comprising a spacer that is an insulator formed to fill spaces between adjacent ones of the second interconnections, wherein each of the first interconnections is an oxide semiconductor containing indium, gallium, and zinc, and each of the second interconnections is metal.

11. The device according to claim 1, wherein each of the first interconnections is wire-shaped, and each of the second interconnections is wire-shaped.

12. A semiconductor device comprising:

a plurality of first interconnections that are oxide semiconductors formed in parallel at predetermined intervals in a first direction on a first layer;

a plurality of gate dielectric films that are formed on surfaces of the first interconnections, respectively;

a plurality of second interconnections that are conductors formed at predetermined intervals in parallel to a second direction on the first layer on which the first interconnections are formed, the second interconnections bridging over the gate dielectric films, the second direction being parallel to the first layer and being orthogonal to the first direction; and a spacer that is an insulator formed to fill spaces between adjacent ones of the second interconnections, wherein each of the first interconnections contains indium, gallium, and zinc, and each of the second interconnections is metal.

* * * * *